United States Patent [19]

Nwasokwa

[11] Patent Number: 5,280,557
[45] Date of Patent: Jan. 18, 1994

[54] NONMATERIAL DEFLECTOR-ENHANCED COLLECTOR (NDC)

[76] Inventor: Daniel C. Nwasokwa, P.O. Box 515 Manhattanville Station, New York, N.Y. 10027

[21] Appl. No.: 378,403

[22] Filed: Jul. 10, 1989

[51] Int. Cl.⁵ .................................. G02B 6/00
[52] U.S. Cl. ............................. 385/146; 126/683; 126/684; 385/147; 385/900
[58] Field of Search ............... 385/146, 147, 900; 359/896, 846, 850, 196, 223; 372/2, 6, 9, 92, 109, 704, 705; 159/903; 126/569, 634, 683, 684, 698

[56] References Cited

U.S. PATENT DOCUMENTS

| | | | |
|---|---|---|---|
| 4,074,104 | 2/1978 | Fulkerson | 219/121.69 |
| 4,127,453 | 11/1978 | Radebold | 204/59 R |
| 4,277,768 | 7/1981 | Burgeson et al. | 335/216 |
| 4,553,037 | 11/1985 | Veazey | 136/291 |
| 4,727,551 | 2/1988 | Scharlemann | 372/2 |

OTHER PUBLICATIONS

Scharlemann, E. T., "Optical Guiding in a Free-Electron Laser", *Physical Review Letters* (Apr. 29, 1985), vol. 54, pp. 1925-1928.
Cai, S. Y., Bhattatherjee A. and Marshall T. C., "Optical Guiding in a Raman Free-Electron Laser", *Journal of Quantum Electronics*, (Sep. 1987), vol. QE-23, No. 9, pp. 1651-1656.
Bhattacherjee, A., Cai, S. Y., Chang, S. P., Dodd, J. W., Marshall, T. C., "Observation of Optical Guiding in a Raman Free Electron Laser" (Oct. 23, 1987 Manscript).
Kumar C., Patel N., and Bloembergen Nicholas, "Strategic Defense and Directed-Energy Weapons", *Scientific American* (Sep. 1987), vol. 257, No. 3, pp. 39-45.
4 Sheets Containing Various Articles from Columbia University Engineering News, issues of: (Winter 1988) vol. 28, No. 5 p. 9; (Winter 1988) vol. 28 No. 2 p. 9; (Spring 1988) vol. 28, No. 3 p. 9 (Fall 1987) vol. 28, No. 1, p. 9.
Nwasokwa, Daniel Chukwuemeka, "Marketing of Passive Solar Thermal Systems", MBA Thesis, Barnch College, City University of New York, N.Y., (May 1987), Includes: Chapters 8 and 1, all the front Matter.

*Primary Examiner*—Frank Gonzalez

[57] ABSTRACT

Nonmaterial deflector-enhanced collector (NDC) is a device in which a nonmaterial, such as electromagnetic (EM) wave, provides a medium in which an obliquely incident nonmaterial (IN) can be intercepted and deflected, so that by proper arrangement, some desired objective can be achieved, such as: deflecting, concentrating, diverging, protecting, receiving, propagating-/guiding—by many (fiber-optic-like) deflections—the IN. NDC comprises: a projector of nonmaterial, PON, its projected nonmaterial deflector(s) ND, and (intended) collector or receiver, C or R. The projector projects the ND obliquely towards the incident nonmaterial to be deflected, IN (such as EM radiation) so that this IN is deflected towards an intended receiver—if any is present. It may be necessary to ensure build up of proper optical density gradient, in the vicinity of the ND, to encourage refraction and/or total internal reflection of the IN. Variations include where the receiver could be a solar energy collector, in which case its energy-receiving/collecting potential can be greatly enhanced by making far more solar energy available to it; or the receiver can comprise an optical system such as may be used for further manipulation of the deflected IN, as when NDC is used as SECONDARY SUN SYSTEM (SSS). Further, the system could be designed to deflect the IN more than once, as may be required to trap straying rays in enhanced NDC or SSS, or required in multiple deflections needed for lengthy propagation of the IN—as in communication systems. In one simple design of NDC, an annular concave reflective surface converges some incident solar rays towards annular plano-concave lens which substantially collimates and projects these rays as intensified solar beam —the ND—to condition the air of the atmosphere to intercept and deflect other incident solar rays which are approaching in a direction which is oblique to direction of the ND. NDC of various shapes can be made from straight projectors of nonmaterial.

20 Claims, 11 Drawing Sheets

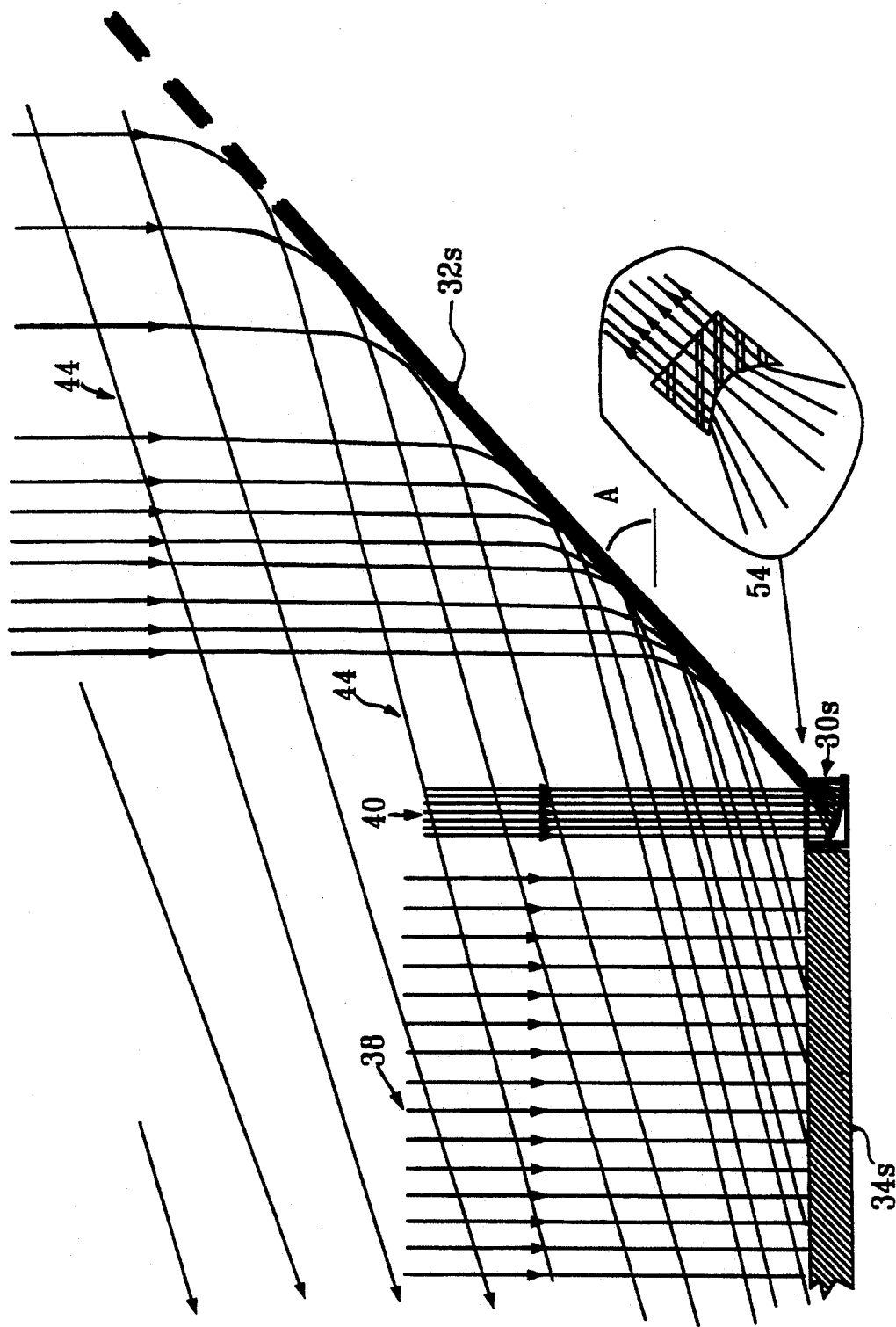

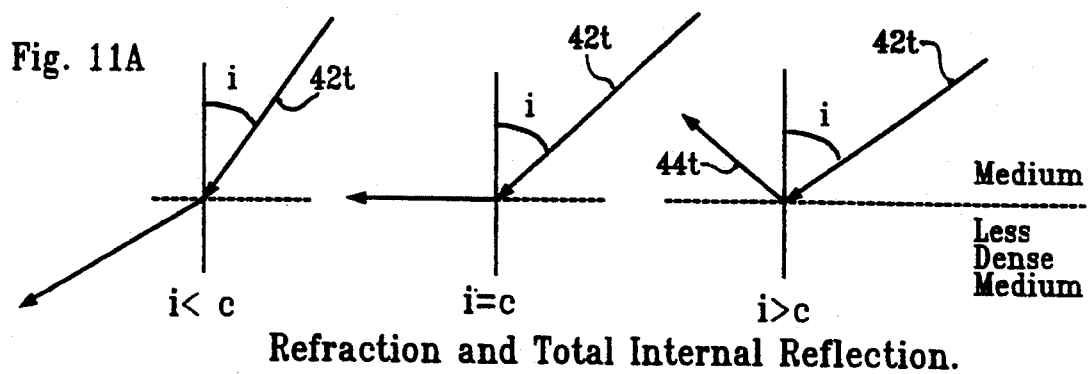
Fig. 11A Refraction and Total Internal Reflection.
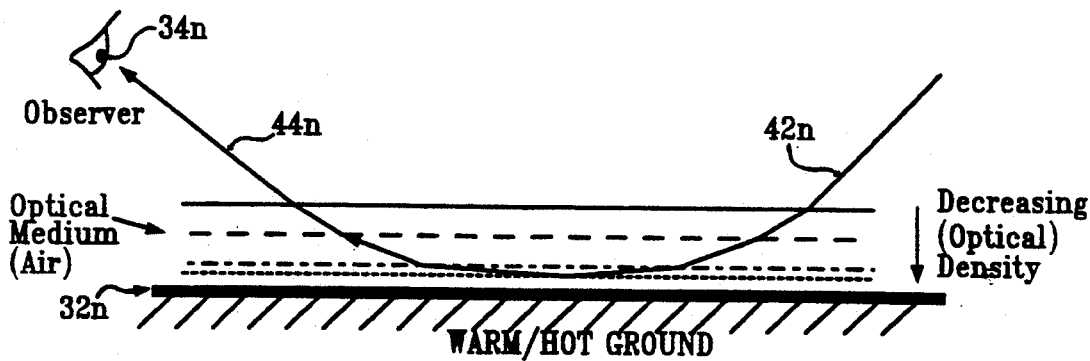
Fig. 11B Mirage — Deflection of a Ray of Light.
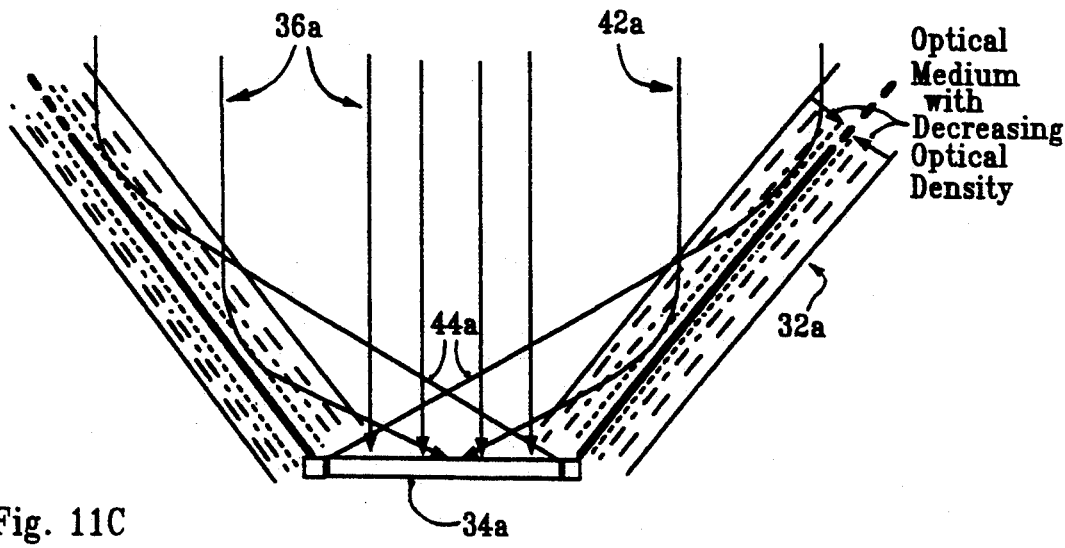
Fig. 11C Application in NDC.

NONMATERIAL DEFLECTOR-ENHANCED COLLECTOR (NDC)

BACKGROUND

1. Field of Invention

This invention relates to means for intercepting, deflecting, concentrating, receiving or collecting "nonmaterials", such as electromagnetic (EM) waves, by using "nonmaterials". More particularly it relates to systems in which "nonmaterial" deflectors are used to make more solar energy available to a receiver such as: solar energy collector, solar cell(s), windows, walls, roofs, other solar thermal systems and optical systems.

The field of the invention thus includes: optics, electromagnetic (EM) waves, (solar) energy, solar energy collector, deflection (e.g. refraction, total internal reflection, reflection), fiber-optics-like guiding of EM waves using EM waves, communication, solar thermal systems.

2. Discussion of Prior Art

Heretofore, solar energy collectors have suffered from the serious limitation of having to have rather large material surface area to be able to collect enough solar energy for some applications. Examples of such applications include powering vehicles, power driven equipments, furnaces and even heating of buildings. In many cases the surface area requirement is not only repulsive but is sometimes prohibitive, and could moreover aggravate structural problems especially under high wind conditions. Of course sometimes the required area is simply not available. Imagine providing a motorcycle the amount of collector area which would permit its continuous normal operation. Though this problem did not escape recognition, there has been what seems like a subconscious succumbing to the failings and inconveniences, due probably to subconscious assumption that it is the "nature" of solar energy for which nothing can be done. Efforts to resolve this have mainly involved using some other material objects like heliostats, reflecting surfaces (or mirrors) and lenses to focus solar rays on the collector. Also there have been efforts to depend on removable solar-rechargeable batteries. In a broader context, heretofore interception, deflection, collection, intensification, or concentration of nonmaterials (e.g. EM waves) have been largely dependent on the use of material objects and other unsatisfactory measures. These old systems waste materials, and leave such to be desired in many respects, including: economy, convenience, power, performance/effectiveness, versatility, reliability. These pose very serious problems, especially in the area of solar energy collection. Also there are currently many efforts (worldwide), especially in the USA, to improve use of solar energy. This invention promises great advances in all of above, as well as in other, areas.

NOTE: "Nonmaterial" is something which is somewhat intangible (as opposed to solids and liquids). Examples of "nonmaterial" include: solar radiation, thermal radiation, radiant energies, processed (or manipulated) electromagnetic radiation/waves (such as laser beam, maser beam, intensified solar beam ISB, intensified electromagnetic radiation), other electromagnetic waves, electric field, magnetic field, gaseous/particulate matter. Also some combination of "nonmaterial(s)" which is not substantially in solid or liquid form is a "nonmaterial".

Henceforth I will refer to "nonmaterial" simply as nonmaterial.

The invention is Nonmaterial Deflector-enhanced Collector (NDC). That is, basically, a collector or receiver of nonmaterial enhanced by means which enables deflection of nonmaterial with nonmaterial. Many variations of this exist.

OBJECTS AND ADVANTAGES

Accordingly several objects and advantages of my invention are:

NDC can improve solar energy collection very significantly. A basic NDC can possibly improve collection of solar energy by up to EIGHT TIMES of what is currently possible for a given area of the conventional solar energy collector. In an NDC, more solar rays are made available to a given area of material collector (if one is present) so that the material collector may collect more solar energy. An enhanced NDC should perform far better than the basic NDC. NDC can be used by almost anything or system that uses and/or supplies power/energy. Examples include: (solar) power plants, solar energy collectors, solar cells, furnaces, stationary plants, vehicles, airplanes, space vehicles/probes, ships, other moving objects, communication systems, optical systems—on land or in space or elsewhere. Also the nonmaterial deflector can be applied in various situations where change in direction of EM wave (or other nonmaterial) is desired.

One way to begin to appreciate the potential of NDC, especially when applied to solar energy collection, is to observe the very numerous deflections (essentially reflections) of solar rays all around us. Such reflections can be seen around automobiles (e.g. car windows and chrome members), around houses (e.g. glass windows and doors). It should be noted that most of these "reflectors" are actually better described as transparent (e.g. glass windows and doors) or as not very good reflectors (e.g. dusty chrome members). Also most of these surfaces are either convex (and therefore tend to diverge the solar rays and reduce the power) or they are mainly plane. Yet looking at even a little bit of these surfaces one can often see a very "brilliant dazzle" of reflected solar rays. One simple version of NDC uses suitable systems where, for instance, a concentrator-projector with "true" reflective surface concentrates these rays and puts them to work.

Means for deflecting light, other electromagnetic waves, or other nonmaterials using nonmaterials as illustrated in NDC (the Nonmaterial Deflector, ND), with or without some intended receiver or collector, can be used in many situations where change in the direction of EM wave (or other nonmaterial) is desired. Such areas of application include: heating/lighting, cooling/shading, optical systems, use of EM wave as fiber-optic element (as in a communication system), or protection from radiation—even for very large areas. Thus there is also good potential for application of NDC even in weather/climate control. NDC can be used to achieve aesthetic effects, (e.g. in buildings and theatres) such as pleasing lighting displays. Also NDC can be used to protect and/or propagate other nonmaterials. It can be used to improve the performance of optical systems (e.g. telescope): Rays from observed body can be afforded some protection from undue dispersion by "tube(s)" of nonmaterial(s)—e.g. "tube(s)" of laser beam. Here fiber optic-like deflections could be arranged for to guide the light rays within "tube(s)" of electromagnetic wave. Please see FIG. 9. Nonmaterial deflector can be used in many situations where use of material deflectors will be inconvenient, extremely difficult or impossible. Examples of this include communicating with very far or remote systems, passage of certain nonmaterials through adverse (e.g. atmospheric) conditions. It should be easy to incorporate NDC concept into already existing systems—especially systems for collecting or deflecting solar/EM radiation. Also NDC effect can be used to deflect/guide other nonmaterials.

NDC can be used to obtain a "SECONDARY SUN"—under human control—whose rays can reach intended locations in a short time. A Secondary Sun (SS) is essentially an NDC located where it can intercept a lot of solar rays and equipped to deliver solar energy to the earth or other location(s). In a Secondary Sun System the receiver could include means for manipulating EM wave (especially solar radiation). For example, such a receiver could have adjustable remotely controlled optical system for concentrating, converging or diverging solar rays. Also a powerful secondary sun system (SSS) may preferably be of enhanced NDC type, where fiber-optics-like deflections are utilized to increase the solar energy available to the receiver of a basic NDC. See FIG. 8 for example of the secondary sun.

A Secondary Sun System can also be very dangerous, especially if misused. A system of NDC type has so much potential that the need for caution to avoid misuse cannot be overemphasized. Especially for the Secondary Sun system, excellent adjustment/shutter means (which may, at least, include one which operates by changing the value of the angle, A, of the projected deflector) is highly desirable.

In addition an SSS should better have multiple communication lines and provision to enable it to self-destruct, in case of any dangerous malfunctioning.

Many other uses and advantages of NDC, its embodiments and concepts abound as could be arrived at by consideration of the content of the ensuing discussions, descriptions and accompanying drawings.

DESCRIPTION OF DRAWINGS

Drawing Figures

FIG. 5 also represents a right section of a straight (segment of annular projector with infinite radius) SCP.

FIG. 6 shows a section through basic simple NDC with working of the deflector system and the SCP depicted.

FIG. 6a shows an enlarged view of rays converging towards optical means (plano-concave lens).

Figure 1:
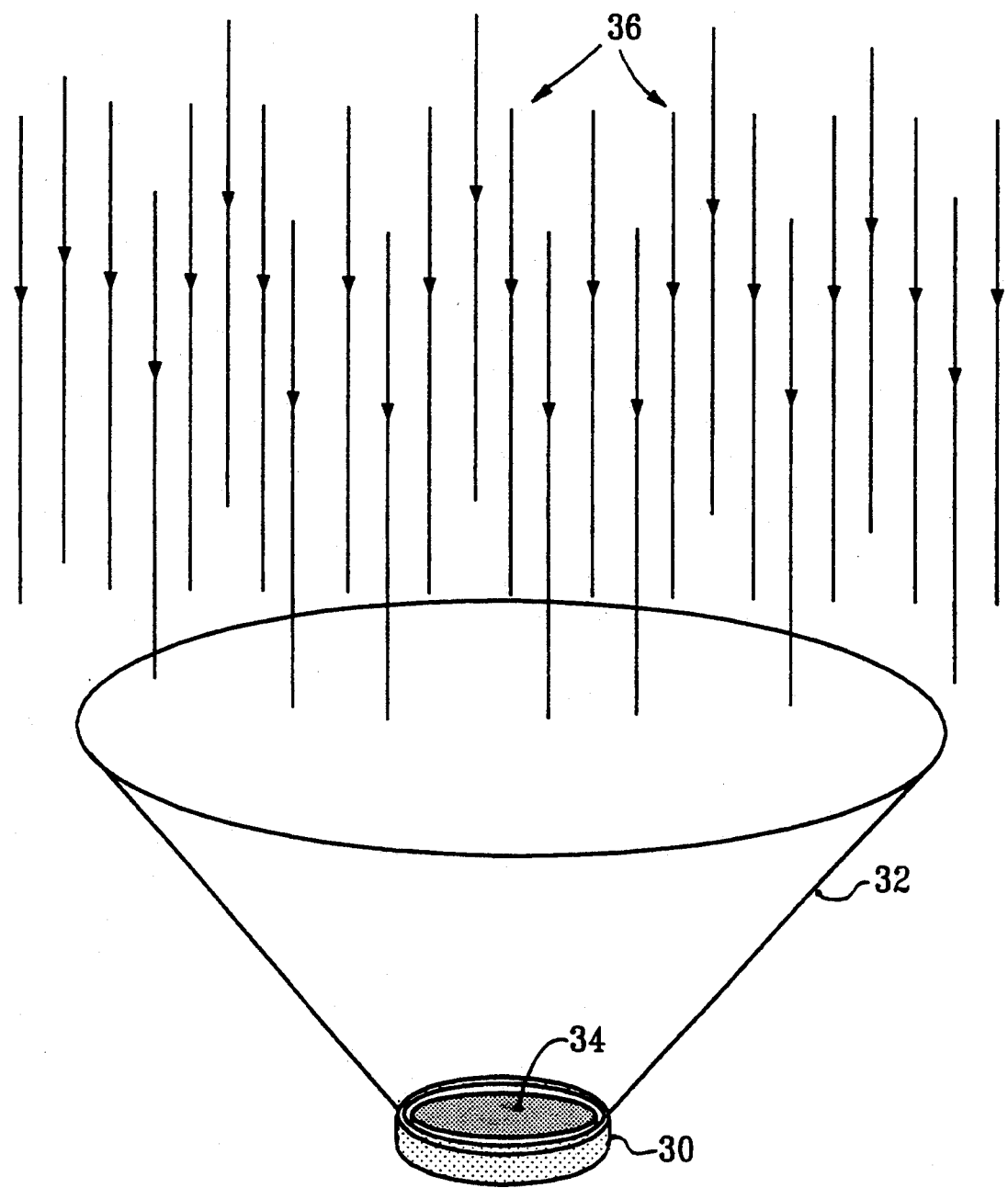
FIG. 1 shows the basic invention (basic NDC)—one having circular receiver, and annular nonmaterial projector—exposed to approaching (incident) nonmaterial.

As in other figures, here the direction of travel of the incident nonmaterial can be reversed.

FIG. 11A, FIG. 11B and FIG. 11C show one foundation for NDC based on refraction, and total internal reflection—such as is used to explain the natural phenomenon of mirage formation. They also show how mirage-like situation can apply to basic NDC—depicting the role of optical medium(s) of with nonuniform optical density (or varying optical density gradient). Here (in the case of mirage) the medium (air) is conditioned by the warm/hot ground. Reference numerals here corrrespond to those already described but have subscripts t, n and a attached. The subscripts correspond respectively to: theoretical (t), natural (n)—such as mirage, and application (a)—such as in NDC.

Figure 12:
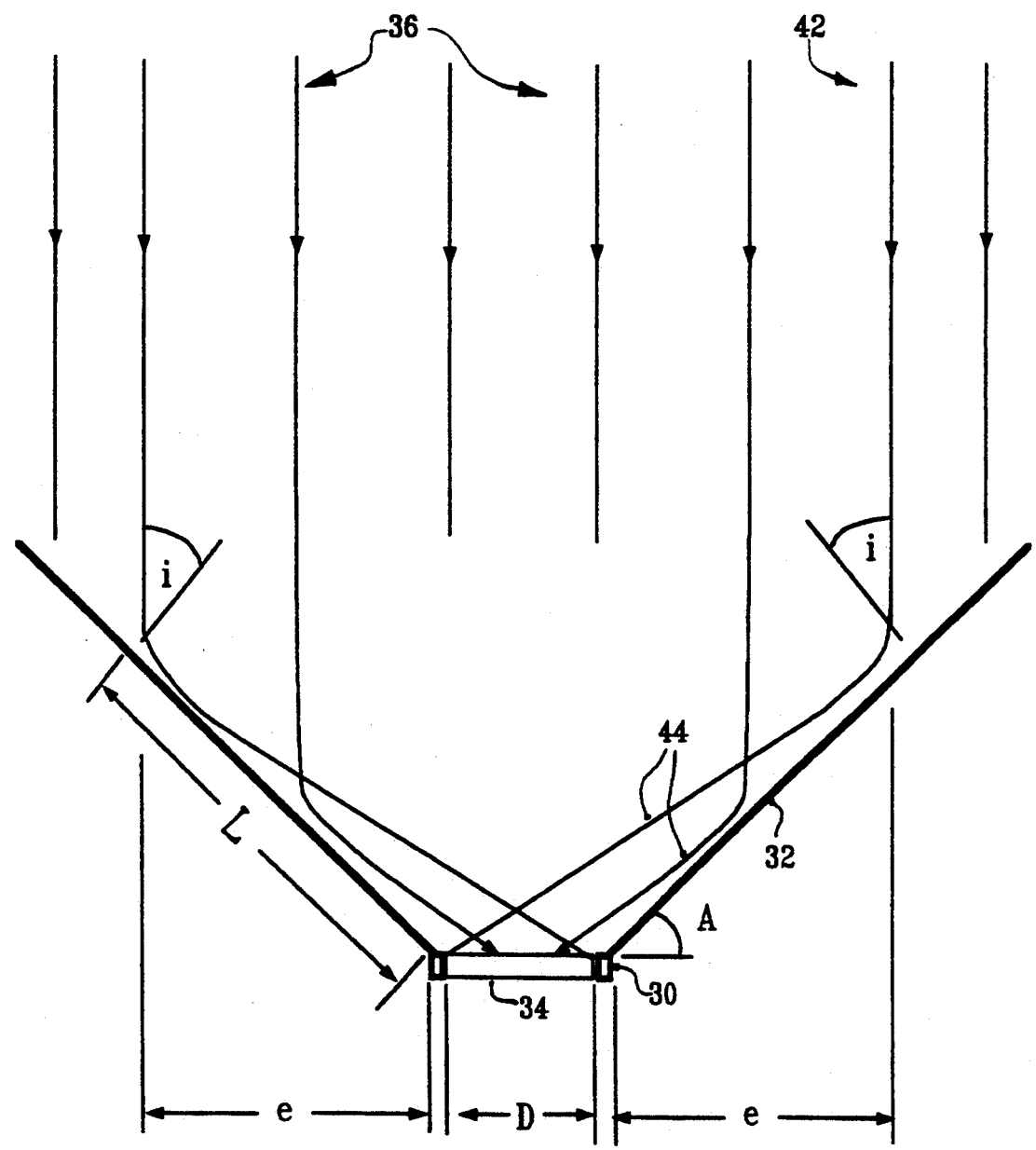

FIG. 12 shows a figure for elementary calculations on NDC.

Figure 13:
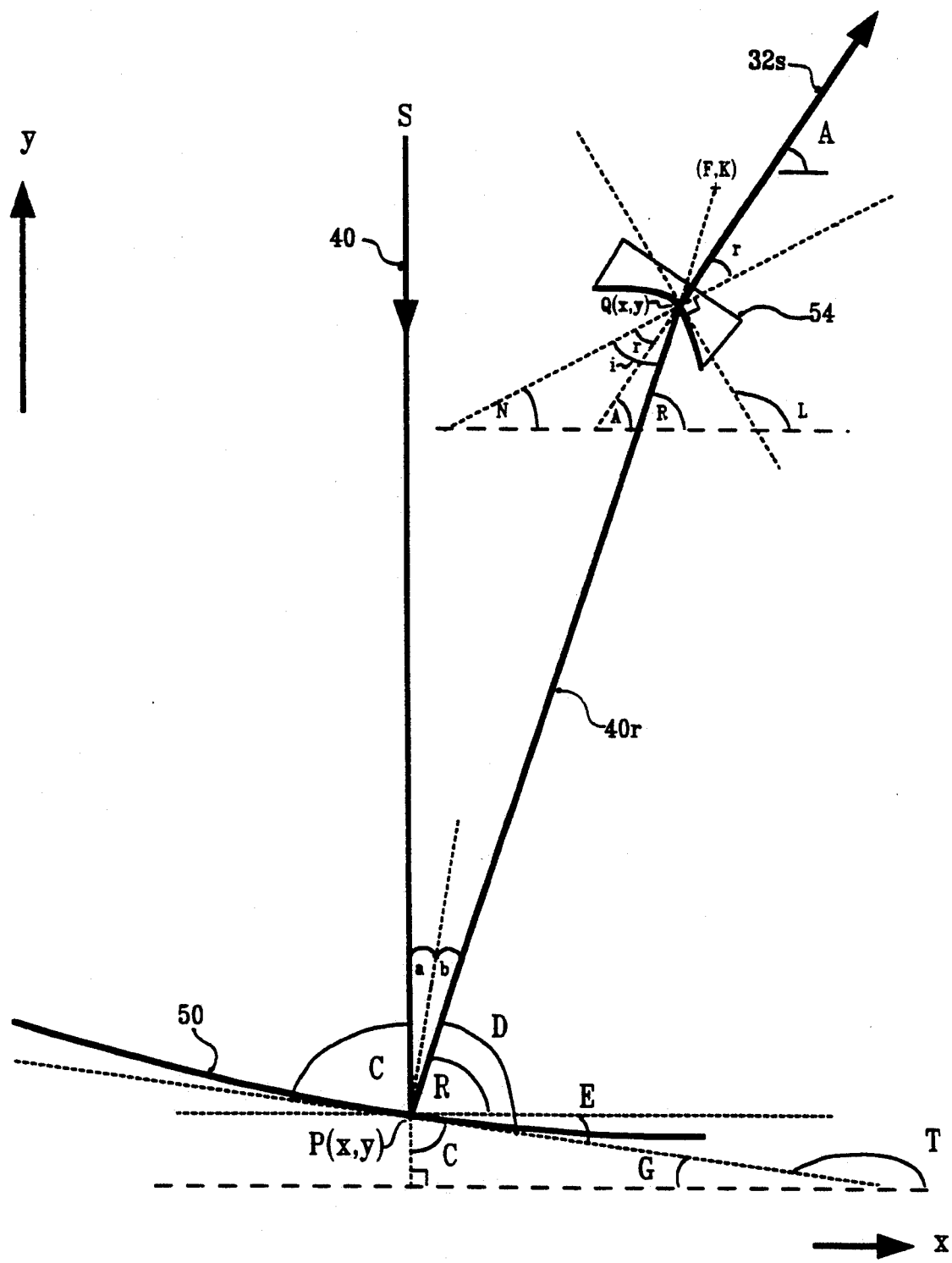

FIG. 13 shows a figure for derivation of equations which may help in profiling parts of simple concentrating projecting (SCP).

LIST OF REFERENCE NUMERALS

30—Projector of nonmaterial—generally
30s—Simple Concentrating Projector of nonmaterial
31—Possible link between 30 and 34 such as may be required to enable 30 and 34 co-operate.
32—Projected nonmaterial, projected by 30
32s—Projected nonmaterial (mainly ISB), projected by 30s
34—Receiver, (intended) receiver of 44. Can be solar energy collector, solar cell(s), other solar thermal system, or means for manipulating nonmaterial (34m)—such as optical system(s), and/or any other thing.
34s—Same as 34, with emphasis on solar energy collector, solar cell(s), other solar thermal system(s)
36—Incident nonmaterial (or Incident rays of nonmaterial), directed towards (or away from) 34, 32 or 32s—at oblique angle with 32 or 32s
38—Solar rays incident on solar energy collector/receiver, 34s
40—Main solar rays concentrated and projected by SCP (30s)
42—Solar rays obliquely incident on ISB (32s)

44—Deflected nonmaterial—i.e. 36 deflected by 32 or 32s

46—Ray(s) straying out of basic NDC

50—Reflective surface—Reflective concave surface preferred. The surface could be that of mirror, metal, plastic or other materials—part of or integral with or just embedded or attached on a material member.

52—Support means maintaining relative positions of 50 and 54

54—Optical system (for receiving converging rays and outputting reasonably a beam of nonmaterial, e.g. ISB)—plano-concave lens used here.

56—Main housing for main components of SCP (50, 54 and likely 52)

58—Transparent cover for SCP—also helps house SCP

60—Incident nonmaterial(s) trapped/guided into receiver by fiber-optic-like deflections enabled by a second deflector system in enhanced NDC 62—60 undergoing fiber-optic-like deflections 64—Probable path 60 would have taken in basic NDC having only 30 (and no 30e)

66—Alternative position of rays when they are made less concentrated

67—Position of rays when they are made more concentrated. Note: 34m could be such that the rays can be directed in many other directions 70—Communication line for remote control (if needed) especially for SSS. There can be many of these in order to enhance safety.

DESCRIPTION OF INVENTION

Please see Figures, especially FIG. 1 and also FIGS. 2, 3, 4, 6, 7 and 8. NDC means: Nonmaterial Deflector Enhanced Collector (NDC). That is a collector or receiver (of nonmaterial, especially EM waves, e.g. solar radiation, light, laser) whose reception of nonmaterial is enhanced by some means for deflecting nonmaterial using nonmaterial deflector.

Thus NDC comprises, essentially, two main co-operating systems:

1. a COLLECTOR or RECEIVER 34—where the generic term receiver (or collector) includes solar energy collector, solar cells or an other thing intended to receive or collect the deflected nonmaterial. Also the (intended) collector or receiver could be absent, remote, or be quite independent of the means for deflecting nonmaterial using nonmaterial.

2. MEANS FOR DEFLECTING NONMATERIAL USING NONMATERIAL (nonmaterial deflecting means or nonmaterial deflector system or nonmaterial deflector): Some system designed to deflect nonmaterial using nonmaterial means comprising:

(a) Means for projecting nonmaterial 30, 30s, which projects(s)

(b) Projected nonmaterial(s) 32, 32s—nonmaterial deflector(s)

In NDC, a means for projecting nonmaterial (projector of nonmaterial or nonmaterial projector) 30 projects a nonmaterial deflector 32 (also referred to by such names as projected nonmaterial) to approach the nonmaterial to be intercepted/deflected (referred to by such names as incident nonmaterial, approaching nonmaterial) 36 obliquely and such that the incident nonmaterial is reasonably deflected. Thus, if it is desired to intercept, collect (gather together) or deflect (in any manner possible) some (incident) nonmaterial, the form, position, orientation and nature of the projected nonmaterial can be properly chosen to suit the task. Moreover, if it is desired to receive or collect the deflected nonmaterial (i.e. the incident nonmaterial after it has been deflected), the means for projecting the nonmaterial deflector, the projected nonmaterial deflector, the incident nonmaterial and the receiver may be suitably relatively positioned and oriented to achieve that objective. The projected nonmaterial (and its projection) is such that when it is projected it usually tends to sweeps out an area whose shape is substantially shape of a ruled surface, such as: conical (or shape of frustum of a cone), pyramidal (or shape of frustum of a pyramid), cylindrical, planar, etc.

Thus NDC is a device which can enable advantageous deflection of nonmaterials (especially EM waves such as light and solar rays, laser beam) using nonmaterial as opposed to using solid or liquid (like lens(es), mirrors, glass, plastic, water, etc.). With NDC, an oncoming, approaching (or even receding) nonmaterial can be intercepted, deflected, converged or diverged, concentrated, received/collected (on some collector or receiver).

The means for projecting the nonmaterial deflector 30 is man-made (i.e. artificial), and the shape of the main area of a suitable medium conditioned by the projected nonmaterial can substantially be predetermined by design of the system. The means for projecting nonmaterial could be complex or relatively simple. For example, where laser beam is the nonmaterial deflector, the means for projecting nonmaterial will naturally be means for projecting laser beam. This should be adjusted to project laser projected nonmaterial that reasonably has the desired nature and form, such as: intensity, power, form/shape, positioning, orientation. On the other hand for the case where intensified solar beam (ISB) 32s is the nonmaterial deflector, a relatively simple arrangement such as described hereinbelow may be used. For any given nonmaterial an appropriate projector should always be chosen.

The projector 30 can tap the energy or nonmaterial it needs from the incident nonmaterial or from the received/collected (heat) energy. The projector could (also) tap energy from some other source. It is advisable to guide against excessive (heat) energy loss. One way to do this is to make the projected nonmaterial thin (say by projecting it from a small outlet cross sectional area. To further guide against excessive (heat) energy loss, it could be arranged to have the nonmaterial projector tap energy from only a certain limited area of a collector or receiver or in some other way control the energy available to the projector.

Figures 5, 5A:
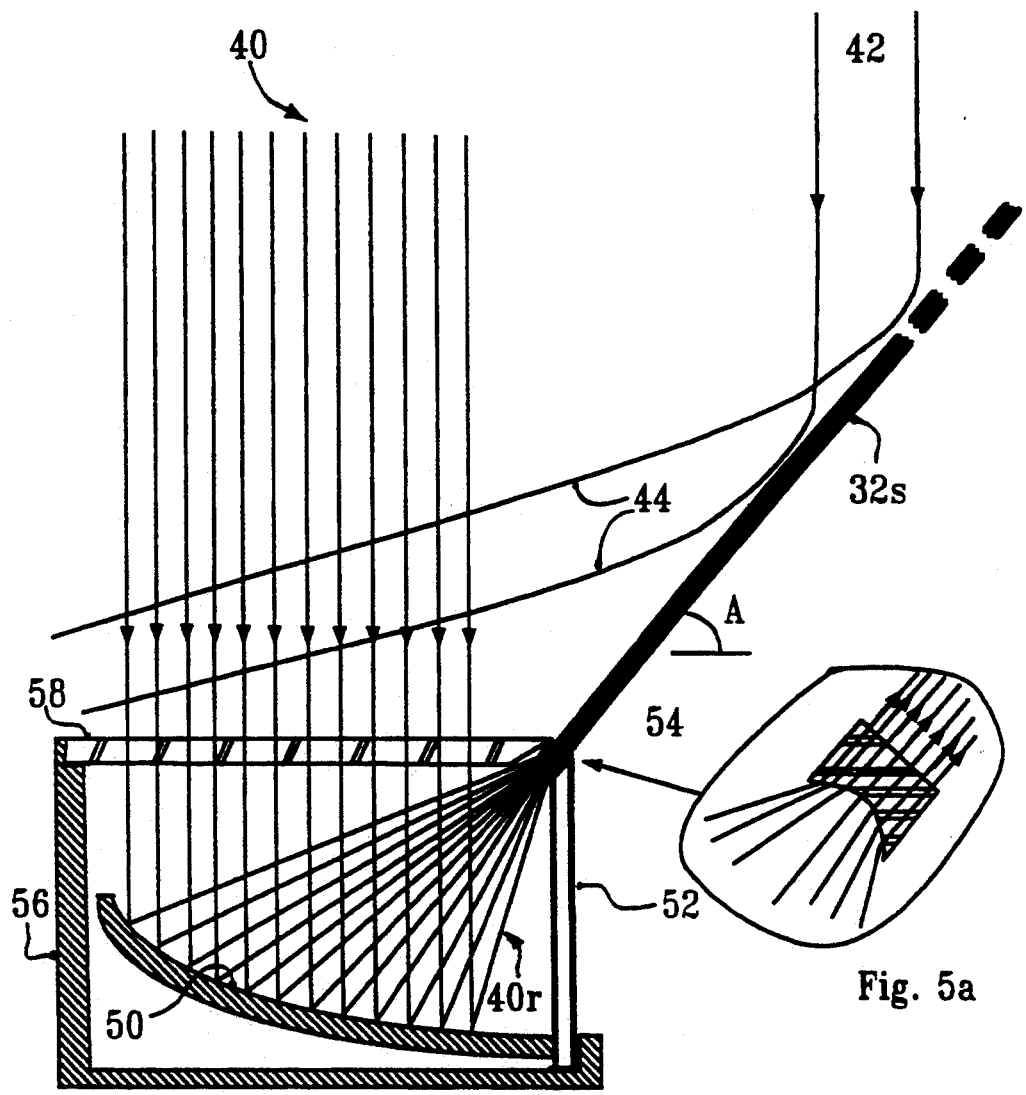
FIG. 5 shows right radial section through an annular (ring-like or circular) simple concentrating projector (SCP). SCP is one type of nonmaterial projector used for illustration.
FIG. 5a shows an enlarged view of rays converging towards optical means [(curved area of) plano-concave lens].

The invention, NDC, is a system which has very many uses among widely varying users. It is therefore normally preferable to make the system simple enough so it can be made and maintained with great ease. NDC was one of many devices conceived while seeking to improve the performance of solar thermal systems—especially solar energy COLLECTORS. Therefore, it will preferably be described more in that context by emphasizing the "Simple NDC". Moreover that context may give it a more universal exposure. In the Simple NDC:

1. the incident nonmaterial 36 (comprising 38, 40 and 42) is the well known solar radiation (or, simply, sunlight)—taken here to be in vertical direction (FIGS. 5, 6);

2. the projected nonmaterial is essentially intensified solar (radiation) beam (ISB) 32s, projected by 3. a simple type of projector of nonmaterial—a "simple concentrating projector" (SCP) 30s.
4. the receiver (though it can still be anything) is more specifically solar energy collector, including solar cell(s) means, represented by a flat circular receiving means 34s.

Further, the simple concentrating projector is taken to be in annular form, and its projected nonmaterial (ISB) is projected away and usually divergently from the SCP at an angle, A, with the horizontal. It should however be clear that many other variations are possible: other projectors of nonmaterials can be substituted, other nonmaterials can be used, the geometrical/structural forms of the projector, the receiver and the projected nonmaterial can vary widely, etc. Actually, in practice, I will normally tend to favor making SCP's which are straight (i.e. arcs of circle of infinite radius, rather than annular). The straight ones (e.g. FIG. 4) should be easier to make and handle, and should be more versatile. They could be used to build SCPs of other shapes including: rectangular, approximately annular, polygonal, elliptical (approximately). The SCP could be made (manufactured) in many different lengths and widths. The different lengths should better enable SCP to match different sizes of receivers or collectors or areas of intended use, while the width may serve as an approximate indication of the strength (power, or effective reach—about effective length) of the ISB the SCP can project.

NDC and its deflector system(s) are very versatile. Applications of NDC vary widely. The systems components, their nature, form, size, etc. should vary widely. For example NDC can be used to make more solar rays available to a collector by using a nonmaterial deflector. The nonmaterial deflector could also be used to "protect" or shield an object (object not on the same side of the nonmaterial deflector as the incident nonmaterial) from the incident nonmaterial. It could be used to deflect an incident electromagnetic wave more than once—and in fact many times so that the electromagnetic wave may be propagated or "guided" within the area of influence of the projected nonmaterial. An NDC designed to help concentrate light on a solar clock (or watch) will differ in many respects from a "secondary sun" designed to tap a lot of solar radiation and deliver energy to required location. Where temperatures are bound to be very high (e.g. in the SSS, the materials used must be able to reasonably withstand the heat. Many other NDC possibilities abound.

To enhance clarity of descriptions, I wish to specify some terminologies used to describe NDC which may be found helpful. The word "BASIC" implies an NDC not (intentionally) enhanced with ability for multiple deflections such as found in fiber-optics. "ENHANCED" implies an NDC so enhanced. The word "SIMPLE" implies an NDC using a simple concentrating projector (SCP). SCP is described below.

The NDC in this description is basic simple NDC and comprises a loop (say annular or polygonal loop) of SCP 30s, the ISB projected by the SCP and a receiver/collector of the deflected (as well as direct) incident solar beam 34s. The SCP is arranged such that the projected ISB 32s is projected divergently upwards towards the approaching solar rays 36 (see FIG. 1, FIG. 6 and FIG. 5). A basic simple NDC with a projector in annular form, and which projects the nonmaterial divergently, will look like a conical bucket. As already shown in the Figures, a projected nonmaterial which is substantially in the form of a truncated cone (or inverted truncated pyramid) will usually be oriented such that the axis of its corresponding cone is substantially in the same direction as the direction of approach of the incident nonmaterial. Thus more solar rays fall in within the space bordered by the material collector (i.e. a receiver or solar energy collector made essentially of solid and/or liquid) and the projected ISB than would have fallen into the unaided material collector. By adjustment/changes in settings such as the projection angle (A) and/or the intensity of the projected ISB, a point is reached when the portion of the incident solar rays directed obliquely towards the projected ISB, gets deflected—essentially towards the material collector. The NDC thus makes more solar energy available to the material collector, essentially by using the projected ISB 32s to deflect and concentrate the approaching solar beam 42 unto the collector. In using NDC, it may be very important to ensure that the projected nonmaterial is projected in an environment (such as one containing air) where an optical medium of varying optical density will form about the projected nonmaterial, as part of the system. This optical medium could encourage total internal reflection in about the same way total internal reflection occurs in mirage phenomenon.

A SIMPLE CONCENTRATING PROJECTOR, 30s and FIG. 5., comprises:
(1) a (loop of) member with REFLECTIVE CONCAVE SURFACE 50, which can converge rays, connected by
(2) some SUPPORT MEANS, 52 which maintains proper relative positions between the reflective concave surface and
(3) (a loop of) an OPTICAL SYSTEM 54 which accepts converging rays (as shown) as input, and outputs intense beam 32s as shown. This optical system can be a diverging lens, e.g. plano-concave lens, double concave lens, diverging meniscus lens. It can be a system of lenses. Also it can be some other optical means.

For purposes of explanation, I will assume that the optical system 54 is a plano-concave lens. The reflective concave surface has a special curvature such that the incident solar rays are concentrated (focused) towards the optical system (e.g. FIGS. 5, 6, 13). Note that any other means for converging nonmaterial, such as other optical means, can be used in place of the reflective concave surface. Example, some system of prism(s) and/or lens(es) arrangement may work. Actually, prisms arranged to cause total internal reflection, are usually preferred to reflective surfaces for deflecting light rays. But (for example) deflecting solar beam with prism and then concentrating it with converging lens is quite involving in many ways, including: economy, weight, manufacturing, handling. The support means 52 can comprise any adequate support member or system which maintains relative positioning and orientation desired of the main systems (50 and 54). This support member can be integral to none, one or both of the two main systems it connects. The connections may be made such that the relative positions and/or orientation of the components can be adjustable. The lens of the plano-concave lens of the optical system has curvatures and orientation such that it transforms the input rays into substantially parallel beam of high intensity 32s moving (divergently) away from the projector as shown in the figure.

The angle (A) the projected intense beam makes with the outer horizontal surface, or the plane to which the incident nonmaterial is perpendicular (as in FIGS. 3, 5, 6, 8, 12 and 13), must be suitable enough for the desired deflection of the incident solar beam 42. Without any intention of limiting the generality of the angle A, I will recommend that the value of A for a simple NDC be chosen to make the MAINP associated with the resultant ISB such that the incident (or approaching) nonmaterial makes an angle of incidence with it about equal to the angle of incidence rays make with air layers of nonuniform refractive index (at about the starting point of the rays deflection) in mirage phenomena. Also the output intensified beam may be made a bit convergent in other to counter any tendency it may have to diverge and weaken or the beam could be made a bit divergent to make it lose its effectiveness over shorter range of its travel. The material (such as one which can withstand high temperatures) and refractive index of the lens should be properly chosen to achieve the desired objective. Satisfactory curvatures of the reflective surface 50 as well as that of the plano-concave lens 54 could be arrived at by trial and error guided by knowledge of optics, or they could be arrived at more methodically. For example, observe that "angle of incidence=angle of reflection" has been approximately obeyed in the figure (FIG. 5) in showing the reflections of rays from the reflective surface. As a further help to those skilled in the art who like to use SCP in their design, the (rather theoretical) derivation of equations for the reflective surface and the plano-concave lens, given in FIG. 13, 13a, 13b, may be found quite useful. Actually, the SCP is an optical device which can be used to concentrate and project electromagnetic radiation for a variety of purposes.

In this application, SCP (the nonmaterial projector), uses part of solar rays (the one projected as ISB—32s from 40) to help collect more solar energy. The ISB should be thin enough to help keep energy loss within tolerable limits while maintaining the system's effectiveness.

In this particular illustration, the ISB is the nonmaterial deflector. The ISB is supposed to penetrate (and condition or "charge") the atmosphere, creating layers of air of varying optical density, with the least dense region about closest to the core (surface or region in the Main Area of Influence of Projected Nonmaterial, MAIPN or MAINP, where optical density of the medium is substantially most lowered) of the ISB. Note that MAIPN can be referred to as MAINP: Main Area of Influence of Nonmaterial Projected. FIG. 11c substantially illustrates possible MAINP and core, especially for nonmaterial assumed projected obliquely towards vertical incident rays. This system can also be aided by other source of power especially during "staring" to supplement/vary the intensity of the ISB.

The power can be made available in many forms including: as heat and/or as light—then concentrated-/intensified. Also a basic NDC or enhanced NDC can use laser beam or other nonmaterial (in place of ISB) as the nonmaterial deflector. Some ways use of other power source(s) can be achieved are by directing (heat and or light) radiation from atop the reflective surface or by heating the bottom part of the reflective surface. In each case enough of the radiation energy should reasonably be concentrated on and projected by the optical system of the SCP.

Enhanced NDC designed to utilize fiber-optics-like deflections (see FIG. 7, also FIG. 8) should perform far better than the a basic NDC. Enhanced NDC can possibly have practically infinite capability especially with a very powerful nonmaterial (e.g. laser beam) as the projected nonmaterial (deflector) and members, including collectors, which can work well enough at high temperatures. In enhanced NDC, more nonmaterial deflectors may be projected from within the (loop of) primary (original/outer) projector to help deflect back straying incident nonmaterial. There may be need to have more than one of these extra projected deflectors depending on such factors as size of the NDC, power (effective reach) of the projected nonmaterial, needs and circumstances. To achieve these multiple (more than one) deflections fruitfully may require adjustments in the various angles of projection. Also there may be need to alter the geometric forms of some of the projections. For instance some projections may be straight (plane sheet) or there may be some need to use a set of intersecting projections (e.g. projections having a cross-section in cross (+) form—i.e. two intersecting "sheets" of beam). However additional projection(s) from a base of about same geometrical form as the original/primary outer deflector appears satisfactory. Also one projected nonmaterial in about prismatic or cylindrical form, such as can be projected from a nonmaterial projecting means which is in loop form (e.g. polygonal, or annular), if oblique to an incident radiation, can be used to achieve fiber-optic-like deflections—with total internal reflections occuring within the "tube(s)" of the projected nonmaterial. Please see FIG. 9.

NDC (Nonmaterial Deflector-Enhanced Collector) can be seen as essentially comprising: Nonmaterial Deflector and a Collector (i.e. a Receiving Means or receiver, which could be: a solar energy collector, some optical system such as lens(es), or some other intended or incidental receiver). The nonmaterial deflector, using nonmaterial, may cause the deflection of obliquely incident nonmaterial towards the collector. Also the nonmaterial deflector can cause the deflection of the incident nonmaterial such that it is discouraged/prevented from moving to what would otherwise have been its receiver.

An NDC can comprise one (or some combination) of the following (where it should be understood that the projected nonmaterial is usually projected into some "nonmaterial" medium (i.e. material medium which is not substantially solid or liquid) such as air);

1. A nonmaterial deflector system (e.g. FIG. 3) comprising:
    (a) artificial means [means made by human being(s)] for projecting nonmaterial 30, such as simple concentrating projector 30s (and FIG. 5) or equipment for projecting light beam or laser beam.
    (b) a projected nonmaterial 32 projected by the means for projecting nonmaterial so as to make an oblique angle with an incident nonmaterial 36, 42 and such that the incident nonmaterial is deflected away from the projected nonmaterial. The projected nonmaterial is the nonmaterial deflector. The incident nonmaterial is mainly electromagnetic radiation.

2. The invention described above and numbered 1, wherein at least one of the projected nonmaterial and the incident nonmaterial is essentially electromagnetic (EM) wave or electromagnetic radiation. (such as light rays or solar radiation).

3. The inventions described above and numbered 1 and 2 wherein some means is provided to enable deflection of the incident nonmaterial (such as 36, 42, 44, 62) more than once. One way of achieving this is by having many projected electromagnetic wave or radiation (e.g. 32 and 32e in FIG. 7), such that the incident nonmaterial is deflected many times within some or all of every two surfaces (which border the incident nonmaterial) provided by the projected nonmaterial. These deflections should be of about the form of total internal reflections found in fiber optics.

4. The invention described above and numbered 1 wherein both the projected nonmaterial 32 and the incident nonmaterial 36 are electromagnetic radiation and at least a portion of (i.e. at least some of or at least part of the projected nonmaterial 32 is derived from part of the incident nonmaterial. Energy can also be tapped from the receiver 34 to help produce the projected nonmaterial.

5. The invention described above and numbered 1, wherein the means for projecting nonmaterial is essentially in some loop form and the projected nonmaterial is projected away (say in a divergent manner) from an imaginary plane immediately covering the front (the face from which projection is made) of the means for projecting nonmaterial —where this imaginary plane intersects an imaginary cylinder which encloses the loop form of the means for projecting nonmaterial. This intersection could usually be at about right angle.

6. The invention described above and numbered 5 wherein a receiving means (or receiver) 34 is also located within the imaginary cylinder, and the projected nonmaterial is projected so as to deflect the incident nonmaterial towards the inside of the imaginary cylinder, towards the receiving means or receiver.

7. The invention described above and numbered 5, wherein the projected nonmaterial 32 or 32s is oriented so that the incident nonmaterial is moving in a direction about same as the overall resultant direction of the projected nonmaterial but in any sense in that direction. Thus, for example, when the incident nonmaterial is in vertical direction (and moving up or down) the projected nonmaterial could be projected symmetrically and divergently upwards. This form of arrangement can be used for collecting solar beam (which is approximately parallel rays). Here, the nonmaterial deflector can be directed divergently and reasonably symmetrically towards an oncoming (incident) solar beam. With a receiver or solar energy collector positioned within this projected nonmaterial, and well in the path of the deflected beam, both the deflected and direct solar beam can be collected (FIG. 1).

8. The invention described above and numbered 5, wherein there may be a multiplicity of projected nonmaterial, each positioned and oriented such that said incident nonmaterial is deflected more than once. The relevant features here include case where there is is only one essentially contiguous projection, such as reasonably cylindrical projection (e.g. 32r of FIG. 9), within whose surface multiple fiber-optics-like deflections can occur. A system can use one or more of such cylindrical projection to guide/transmit incident nonmaterial in any direction within the MAINP.

9. A nonmaterial deflector-enhanced collector, wherein a conventional solar energy collector is a subset of a receiving means (or a receiver), 34 and solar radiation is a subset of an incident nonmaterial (i.e., nonmaterial to be deflected) 36, comprising:

(a) means for projecting nonmaterial, 30
(b) a projected nonmaterial 32 projected by the means for projecting nonmaterial and such that the incident nonmaterial is deflected towards
(c) the receiving means (or receiver), 34.

The nonmaterial should be projected to make an oblique angle with the direction of the incident nonmaterial.

The projected nonmaterial is the nonmaterial deflector. Projecting it such that it makes oblique angle with the incident nonmaterial helps enable deflection (such as total internal reflection) to occur. The direction of the deflected nonmaterial, 44 should likely be reasonably predictable.

10. The inventions described above and numbered 1 thru 9 and those described below and numbered 19 and 20 wherein optical medium such as air of variable optical density is ensured present in the vicinity of the projected nonmaterial—with the lowest density layer or regions being closest to the core of projected nonmaterial so that the incident nonmaterial is deflected by this optical medium.

This optical medium could be in the form of some non-liquid fluid such as gas(es) (e.g. air) with layers or regions reasonably at varying temperature.

11. The invention described above and numbered 9, wherein the receiver is a means for manipulating electromagnetic waves.

The word "manipulating" means controlling by artful means, utilizing, handling or treating—especially skillfully; "Manipulating" includes various things which can be done to ray(s) or beam(s) of electromagnetic radiation/wave or radiant energy (including: deflecting, refracting, reflecting, fiber-optic-like guiding/deflections, converging, diverging, concentrating, collimating, focusing, intensification, amplification, filtering, diffracting, polarizing), and various combinations of these things. Also processing and processed are taken to be substantially synonymous with manipulating and manipulated respectively.

12. The invention described above and numbered 9 wherein the incident nonmaterial 36 is essentially solar radiation and the invention is located where it, can intercept a lot of solar beam, such as away from the earth (ensuring presence of adequate medium), and the receiver is a system 34m which includes means for manipulating electromagnetic radiation, such as (remotely controllable) optical system. Also the invention may be made such that it can deliver energy to other locations (e.g. earth). This invention may thus serve as a "SECONDARY SUN" (SS). or "SECONDARY SUN SYSTEM"(SSS), FIG. 8, which may be used to illuminate/-heat (e.g. dark or cold areas) or perform other functions on earth or elsewhere. A very powerful SSS may better be of enhanced NDC type.

Figure 10:
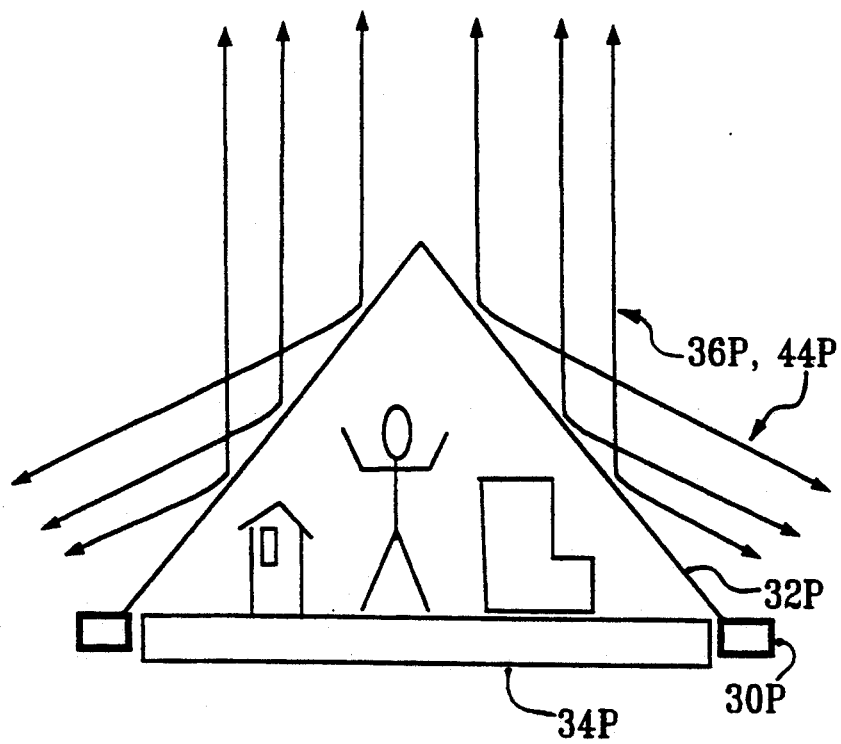
FIG. 10 shows NDC with its projected nonmaterial such as to provide some object(s) protection from incident nonmaterial.

13. The inventions described above and numbered 1 and 9 wherein the projected nonmaterial may be projected such that an object not on the same side of the projected nonmaterial (the deflector) as the incident nonmaterial may be afforded some protection from the incident nonmaterial This can be achieved by projecting the nonmaterial (FIG. 10) in converging manner (and such that the incident nonmaterial is deflected divergently by the projected nonmaterial) in invention above numbered 6, if one wanted to protect the receiving means (or receiver) from the incident nonmaterial.

14. The invention described above and numbered 9 wherein the projected nonmaterial is a laser beam, light or other electromagnetic radiation; the incident nonmaterial is solar radiation; and the receiving means (or receiver) is an element substantially selected from the group consisting of means for collecting solar energy and means for manipulating radiant energy which is relatively positioned to receive the deflected solar radiation. Note that the receiver can be essentially absent, remote, or be independent of the other parts of the NDC.

15. In means for collecting electromagnetic energy, the improvement comprising the improvement invention described above and numbered 9 wherein the projected nonmaterial 32 at least includes an electromagnetic wave, the incident nonmaterial is essentially electromagnetic and the receiving means (or receiver) is means for collecting electromagnetic energy and the projected nonmaterial directs the electromagnetic wave towards the means for collecting electromagnetic energy, thereby enhancing the quantity of electromagnetic energy available to said means for collecting electromagnetic energy.

16. The invention described above and numbered 9, wherein the projected nonmaterial is projected such as to enable fiber-optics-like deflection of the incident nonmaterial.

17. The invention described above and numbered 9 thru 16 and the inventions described below and numbered 19 and 20 wherein a suitable medium (e.g. gas) of varying optical density is substantially sustained in the vicinity of the projected nonmaterial, such as in the form of a gas mixture with layers reasonably at different temperatures; so that the incident nonmaterial is deflected by the optical medium as the incident nonmaterial nears the core of the projected nonmaterial, and as the incident nonmaterial recedes from the core of the projected nonmaterial so that the incident nonmaterial is deflected by the optical medium as the incident nonmaterial nears the projected nonmaterial, and as the incident nonmaterial recedes from said projected nonmaterial.

18. The inventions described above and numbered 1 and 9 wherein the projected nonmaterial at least includes intensified electromagnetic radiation, derived from the incident nonmaterial.

19. Means for concentrating and/or projecting and/or deflecting nonmaterial comprising:
   (a) a means for converging rays of nonmaterial, wherein some of the incident rays of nonmaterial is output as converging rays of nonmaterial, said means for converging rays of nonmaterial being linked by
   (b) some support means (say support member(s)), to
   (c) means for manipulating nonmaterial, such as optical means, which, with said converging rays of nonmaterial as input, outputs
   (d) an intesified beam of nonmaterial reasonably at proper intensity and orientation to cause deflection of some of the incident nonmaterial.

20. The invention described above and numbered 19 wherein the incident rays of nonmaterial is solar beam and the intensified beam of nonmaterial is intensified solar beam.

21. The invention described above and numbered 19 further including an optical medium of varying optical density, ensured present in the vicinity of the intensified beam of nonmaterial, the lowest optical density regions of the optical medium being close to the core of the intensified beam of nonmaterial so that some of the incident rays of nonmaterial is deflected in the optical medium.

NOTE: The BASIC NDC (i.e. one without fiber-optic-like deflection enhancement) can possibly be designed to improve collection of solar energy (or other nonmaterial) by up to about 800% (see calculation below). Enhanced NDC designed to utilize fiber optics-like deflections (see FIG. 7) is expected to perform far better—possibly, can have practically infinite capability especially with a very powerful nonmaterial (e.g. laser beam) as the projected deflector and a material collector or receiver which can collect/receive at very high temperatures.

OPERATION OF THE INVENTION

Understanding NDC—Some Helpful Areas and Theories

NDC was conceived during efforts to improve the performance of solar thermal systems, especially solar energy collectors. In this context the field of the invention includes solar energy collectors and solar energy. Here the invention seeks to improve performance of the collectors by enabling more solar rays to reach a collector of given area. Collector here includes thermal energy collector as well as solar cell(s). Also the term "collector" here can be viewed somewhat more generally as a receiver so that it includes any other receiver, including optical systems or arrangements, whose main purpose may be different from collection (extraction-/absorption) of incident nonmaterial. Heretofore efforts to deflect electromagnetic waves or concentrate electromagnetic waves on a receiver have been approached by using material objects (like mirror, lens, liquid, etc.) to intercept and deflect the rays. This invention uses nonmaterial deflector to deflect or concentrate electromagnetic rays (unto a receiver).

I do not want to be bound by any unrequired theoretical explanations, but I believe the following explanation(s) to be relevant and interesting in understanding the invention, NDC.

Facts that support the workability of the NDC idea include:

(1) Formation of mirage which is due to deflection of light (especially sunlight) close to ground surface. This should be mainly due to the fact that the ground is warm enough. The process could also be influenced by the evenness (lack of excessive roughness) of ground surface. It is believed to be caused by the process of continuous refraction, and eventual total internal reflection of light, as light rays penetrate into continuously (optically) less dense air closer to the (sun-) heated ground surface. As refraction (away from the normal) goes on, subsequent angles of incidence increase so that a point is reached when total internal reflection occurs—as the critical angle of incidence gets exceeded. Please see FIG. 11A and 11B. Following this explanation it seems clear that at the point when critical angle is reached a ray would be very unstable and may even not necessarily be heading into an optically less dense part of the medium. However it also seems clear that at such unstable state there likely will be total internal reflection due to (even very small) disturbance.

Mirage phenomenon offers what seems to be a conclusive proof of the workability of NDC—at least for NDC using hot nonmaterial (s) (example: thermal radiation, ISB or laser beam). This is because with these nonmaterials we can simulate the warm/hot ground condition, present in the case of mirage, in the atmosphere and therefore can very realistically expect solar (or other) rays to be deflected. With proper design, we can then deflect the rays advantageously.

Note: If mirage phenomenon explanation (or theory) is accepted as reason for the workability of NDC, it is worth noting that the hotter projected deflector (such as the intensified solar beam, ISB) is not necessarily a deflector per se (even though it can be), but acts as an activator of the deflection potential of air by creating the air spectrum of varying optical density—i.e. creating optical density gradient. Further it will also follow that what matters more in such cases where hotter bodies are used as nonmaterial deflector is the relative optical densities (and therefore the relative temperatures or slope of the temperature distribution or temperature gradient) across the various resulting air layers. Thus such NDC should be able to operate irrespective of the temperature of the environment provided the projected deflector is maintained at appropriate state to provide the needed temperature differential. That is, the NDC should be able to operate both at ordinary weather conditions, as well as in extreme winter or in extreme summer weather conditions. In fact NDC should be expected to operate in all weather conditions.

(2) Optical density of a medium (say as evidenced by its ability to refract light) is known to depend on the electrical and magnetic properties of the medium. So it should be expected that electrical and/or magnetic means (including electromagnetic means, e.g. electromagnetic wave) can be used to change the optical density of a medium. This change can be effective over a wide or narrow range and the magnitude and nature of the resulting optical density gradient could also vary. However, whatever the case, the presence of any of these nonmaterials will tend to alter the behavior of electromagnetic waves in the medium. Thus we should expect a suitable medium, such as air (or other non-liquid fluid), into which these nonmaterials are introduced to deflect electromagnetic (3) It is known that certain processes (like passage of high energy beam) are capable of charging the air of the atmosphere (or some other gas(es). The "charging" implies changing the electrical (and possibly magnetic) properties of the air. Thus we expect part of the air so affected and part of the air not affected (or part of the air not affected to the same degree) to usually have different optical densities, so that there is optical density gradient. With such optical density gradient suitably configured we expect that electromagnetic wave(s), properly (obliquely enough) directed across some multiplicity of layers of the air at different optical densities, will be deflected.

(4) Well focused torch light can travel far and still maintain resonable intensity. Also solar beam can travel very far, do travel very far before reaching us, and can still travel very far even after reflection. Further solar beam can be intensified so that enough of the intensity remains even after the beam is attenuated over considerable distance through the atmosphere. Thus solar beam can be used as projected nonmaterial as in the concentrating projector using ISB.

(5) Solar beam, solar radiation or sunlight, ISB (as well as other lights) are electromagnetic.

(2), (3), (4) and (5) above lend additional support to the workability of NDC, even for nonmaterials having other than thermal effects. Also these strengthen the confidence in the workability of NDC that is believed workable mainly due to change in optical density due to thermal effect in "mimicry" of mirage phenomenon.

Operation of the Invention

NDC deflects electromagnetic waves and enables more electromagnetic waves to reach a receiver by deflecting the incident electromagnetic wave towards the receiver.

Please refer to FIGS. 1-6, 11A, 11B, 11C, 12 and 13. A simple basic version of NDC (FIG. 6) consists of a loop of projector of intensified solar beam (ISB) $30s$ shaped and positioned such that the projected ISB $32s$ diverge (conically) upwards. It is further oriented such that incident solar rays 36 approach the inside of this projected ISB. More precisely, the rays impinge on the spectrum of medium (such as heated air) of varying optical density within or in the vicinity of the ISB (see FIG. 11B and C). With the (hot/warm) ISB here as the nonmaterial, or each line across the surfaces of the MAINP, the medium (e.g. air) closest to core (likely the hottest part) of ISB is least dense.

Following the explanation that the mirage phenomenon is due to refraction and eventual total internal reflection [as rays approaching hot/warm ground surface penetrate an optical medium (mainly air) of decreasing optical density] then in this case we should expect the following similar explanation to apply:

As a ray approaching the core of the projected ISB penetrates the spectrum of optical medium (e.g. air: FIG. 11A, 11B and 11C) layers/region towards the optically less dense layers/region closer to (or within) the projected ISB, it keeps getting deflected (away from the normal so that its subsequent angles of incidence keep on increasing until eventually an angle of incidence equal to the critical angle of incidence is reached. After this the ray gets totally internally reflected. Given that the least optically dense region should be the core of projected nonmaterial, ISB, we expect the total internal reflection to occur before a ray can pass out of the core of ISB. See FIG. 11A, 11B and 11C.

Simply imagine the ISB substituted for the hot/warm ground shown in the mirage case. It then follows that with this arrangement the incident rays will also be deflected as though mirage phenomenon has been induced to occur in the atmosphere. Also the deflection can take place due to direct electrical or magnetic effects of the projected nonmaterial—such as suggested by (2) to (5) above. Each deflection occurring in the cases of multiple deflection can also be explained in the manner given here.

Figure 2:
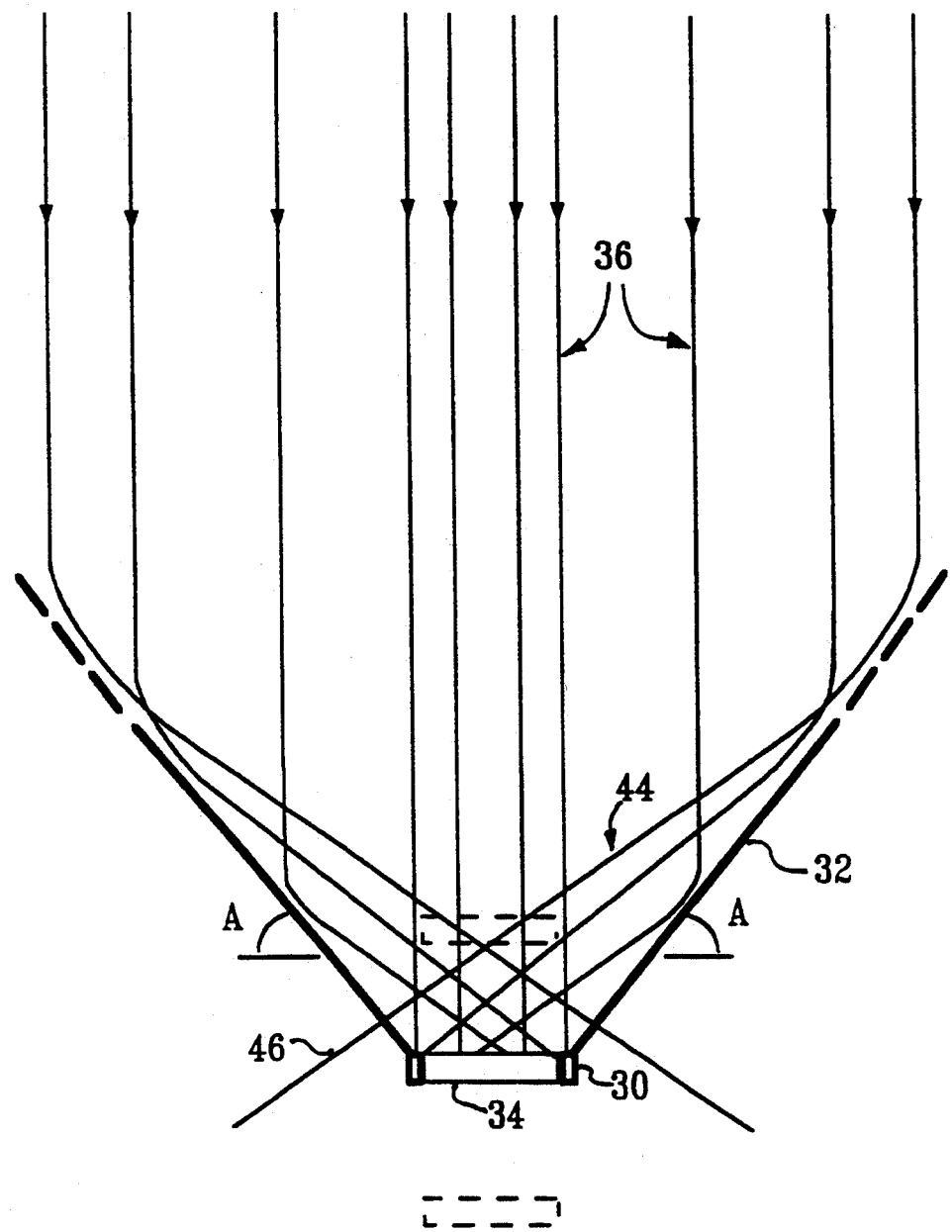
FIG. 2 shows a section of FIG. 1 obtained by bisecting FIG. 1 vertically. Some alternate positions of the receiver are shown.
Figure 3:
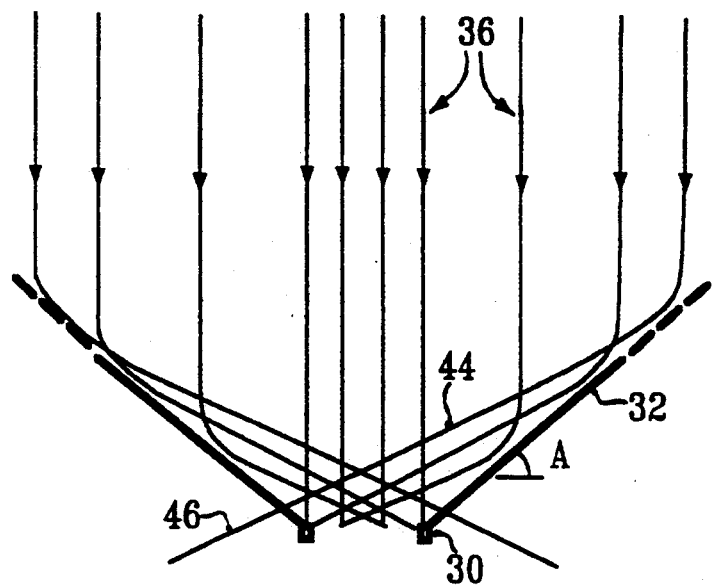
FIG. 3 shows only the basic nonmaterial deflector system of FIG. 1—with intended receiver very remote or absent.

FIGS. 1, 2, 6 show arrangement(s) with which the rays can be directed into a collector or receiver after the deflection. Somewhere within the loop of the nonmaterial projector, or its forward or backward extension(s), could be placed some collector or receiver. This receiver could be a solar energy collector (including solar cells), some optical system(s) or some receiving means or any other object.

FIG. 5 shows a cross sectional view of one possible design of simple concentrating projector. Here we are in effect using some of the incident solar radiation 40 to help us collect more solar rays. Some of the incident radiation 40 are converged and concentrated by the reflective surface 50 towards the plano-concave lens 54 which then projects the rays as intense solar beam $32s$. This intensified solar beam (then) acts as a projected nonmaterial deflector and helps to deflect other incident solar radiation 42.

Also (if need be), NDC can be started off (initially) by an external power-source. This power source will essentially generate some initial intense radiation wave. Once started the system should then be able to collect enough energy to generate and project its own intense radiation and sustain its operation. This is somewhat similar to the way engines are started. The system can also use some rechargeable storage battery of cells to help cushion power variations and better maintain its operation. During periods of high power (say during intense sunshine) the system stores some energy in the battery and during periods of low power the system can use some of the stored energy to help keep the nonmaterial projector functioning or help restart it.

FIG. 12 shows how an NDC may achieve its limit in increasing the area of a receiver. As shown—for the given configuration of angles, power of the projected nonmaterial and receiver surface area—the outermost reflected (cylinder of) incident solar rays strike the edge of the receiver. The calculations in FIG. 12a (page 1B) uses FIG. 12 to show that basic NDC can possibly collect about NINE (9) times as much energy as an unaided material collector.

Elementary Calculations on NDC

Apparent increase in surface area of the receiver of NDC is given by:

$$s = \text{new (apparent) area} - \text{old area}$$
$$= \pi(D + 2e)^2/4 - \pi D^2/4$$
$$= \pi D^2/4 + \pi e^2 + \pi De - \pi D^2/4$$
$$= \pi e^2 + \pi De$$

where: $e = L\cos A$ i.e.

$$s = \pi[(L\cos A)^2 + D L\cos A]$$

If we assume $L\cos A = D$, then $$s = 2\pi D^2 = 8(\pi D^2/4) = 800\% \text{ increase in the area of unaided collector}$$

or new apparent area of the collector $$S = 8(\pi D^2/4) + \pi D^2/4 = 9(\pi D^2/4)$$

Therefore (at least theoritically) basic NDC can possibly improve collection of solar energy or other nonmaterial(s) by up to about 800%, or with NDC apparent surface area of a collector can become about *NINE TIMES* the surface area of the material collector.

Enhanced NDC designed to utilize fiber-optics-like (see FIG. 7; also FIG. 8) deflections can perform far better—possibly, can have practically infinite capability especially when it uses a very powerful nonmaterial deflector (e.g. laser beam). Here a process of continuous deflections enables the enhanced NDC to trap rays which would have strayed off the (ordinary) basic NDC.

Derivation of Profile of Reflective Surface of SCP

Relevant Question:
What is the profile of the reflective surface such that it reflects any vertical ray incident on it towards a focal point (F,K)?

Solution:

$a$ should = $b$; or $C$ should = $D$; or $\tan C$ should = $\tan D$ $$C = \Pi/2 - G = T - \Pi/2$$

$$\tan C = \tan(T - \Pi/2) = -\tan(\Pi/2 - T) = \cot T =$$
$$-1/\tan T \rightarrow \tan C = -1/(dy/dx)$$

$$D = R + E = R + G$$

$$\tan D = \tan(R + G) = (\tan R + \tan G)/(1 - \tan R \tan G)$$

where:

$$\tan R = (K - y)/(F - x) = (y - K)/(x - F)$$

$$G = \Pi/2 - C \rightarrow \tan G = \tan(\Pi/2 - C) = \cot C = -(dy/dx)$$

$$\tan D = [(y - K)/(x - F) + (-dy/dx)]/\{1 - [(y - K)/(x - F)](-dy/dx)\}$$

$$\tan C = \tan D \rightarrow -1/(dy/dx) = \{[(y - K)/(x - F)] - dy/dx\}/\{1 + [(y - K)/(x - F)](dy/dx)\}$$

i.e.

$$(dy/dx)^2 - 2[(y - K)/(x - F)](dy/dx) - 1 = 0$$

[A quadratic equation in $dy/dx$]

$$dy/dx = (y - K)/(x - F) + (\text{or} -)\{[(y - K)/(x - F)]^2 + 1\}^{\frac{1}{2}}$$

Chose $-ve$ value of the square root:

$$dy/dx = (y - K)/(x - F) - \{[(y - K)/(x - F)]^2 + 1\}^{\frac{1}{2}}$$

One numerical (approximate) approach to using above equation:
1. Chose initial x and y values: $x_o$ and $y_o$.
2. Compute dy/dx from above equation.
3. Increment x by small amount, Dx.
4. Compute corresponding y from $y = y_o + (dy/dx)Dx$
5. With latest x and y values (instead of $x_o$ and $y_o$), go to 2.

Derivation of Profile of Plano-Concave Lens of SCP

Relevant Question:
What is the profile of the lens's concave surface which refracts any ray from under it heading towards a focal point (F,K) such that the ray emerges inclined at an angle A to the horizontal? (Assume refractive index of lens' material relative to the medium (such as hot air) in the environment of the lens' concave surface = n)

Solution:

$$\sin i/\sin r = n$$

where:

$$i = R - N = R - (L - \Pi/2) = R + (\Pi/2 - L)$$
$$r = A - N = A - (L - \Pi/2) = A + (\Pi/2 - L)$$

$$\sin i/\sin r = n$$

$$= (\sin R \sin L + \cos R \cos L)/(\sin A \sin L + \cos A \cos L)$$

$$= (\sin R \tan L + \cos R)/(\sin A \tan L + \cos A)$$

$$= \{[(K - y)/[(F - x)^2 + (K - y)^2]^{\frac{1}{2}}](dy/dx) + (F - x)/[(F - x)^2 + (K - y)^2]^{\frac{1}{2}}\}/\{\sin A (dy/dx) + \cos A\} = n$$

-continued $$\{(y - K)/[(x - F)^2 + (y - K)^2]^{\frac{1}{2}} + n \sin A\}dy +$$

$$\{(x - F)/[(x - F)^2 + (y - K)^2]^{\frac{1}{2}} + n \cos A\}dx = 0$$

Above Equation is exact and has the implicit solution:

$$[(x-F)^2+(y-K)^2]^{\frac{1}{2}}+(n \cos A)x+(n \sin A)y = C = \text{constant}$$

One approach to using above equation:
Chose desired (initial) values for x and y.
Compute and save the corresponding constant (C), $C_o$ say
Chose various other values of x, and
Compute corresponding y values which yield $C=C_o$ close enough.
The (x,y) values from above then yield a particular profile.
Other initial values of x and y can be chosen to obtain other particular profiles.

CONCLUSION, RAMIFICATIONS AND SCOPE OF THE INVENTION

In NDC, the means for projecting nonmaterials (i.e. the nonmaterial projector) can be of any design, including the simple design already described which projects ISB. The nonmaterial projector can be designed for projecting any other nonmaterial, like: laser beam, or other electromagnetic wave.

Figure 4:
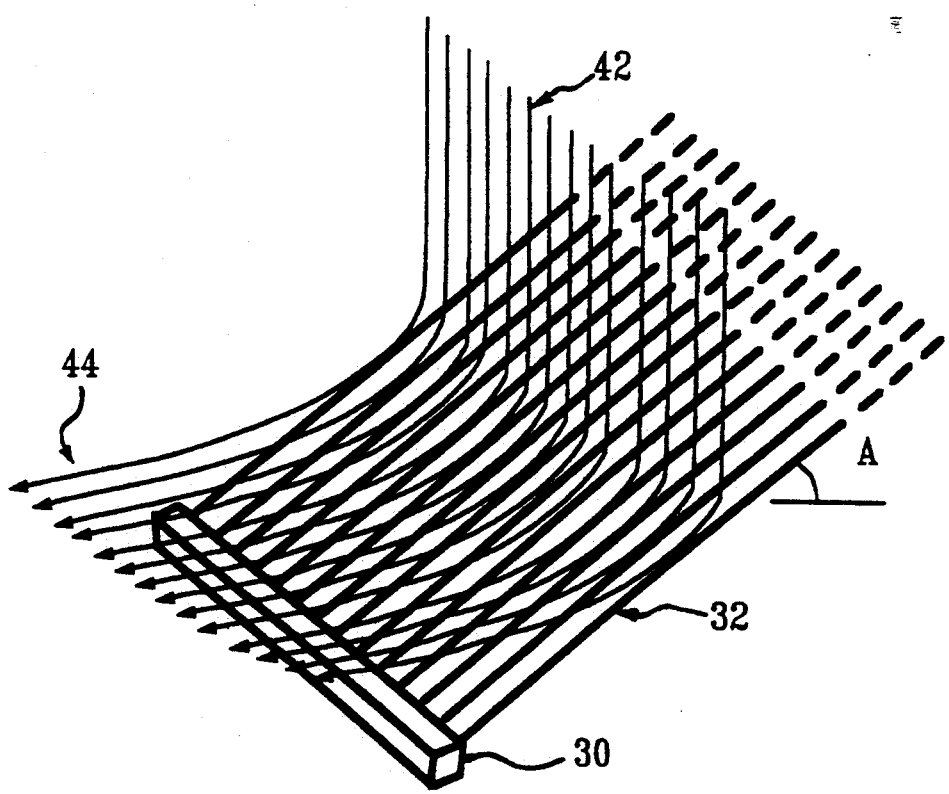
FIG. 4 shows a planar nonmaterial deflector system with a straight projector of nonmaterial—such a system can be a building block of other shapes of nonmaterial deflector system.

The nonmaterial projector of NDC can also assume other geometrical configuration. Example: the nonmaterial can be projected from reasonably straight projector as a planar (with nearly plane face(s)) "sheet" of beam (FIG. 4). The projector's outlet (nonmaterial outlet sectional area) can be designed in various (combination of) shapes e.g.: straight, rectangular, circular, polygonal, elliptical, segmented, in any loop, partial loop, rectangular, ring and/or modular forms. The modular form of design include a design where means for projecting nonmaterial is designed of relatively short strips of projectors which can then be coupled together or arranged independently in the desired shape or form. Example short strips of projectors could be made such that one can use them to obtain a projector of essentially polygonal or (roughly) annular or elliptical shapes. Further the projector may be used alone or used with a receiver or collector. Also where used with collector or receiver, the projector (integral or modular) could be integral with the receiver or it could be relatively independent of the receiver.

The projected deflector (e.g. ISB) can be some other nonmaterial. That is: NDC can use some other nonmaterial as its deflector. Some applications (e.g.: moving vehicles, space applications) may actually require the use of certain (categories of) projected deflectors, instead of thermal radiation wave or ISB. Some reasons for this is that where certain optical media, such as air, are needed around the projected nonmaterial some environments (e.g. space) may not be able to provide the medium; also fast moving objects will likely not be able sustain enough reasonably defined optical density gradient in various media due to their projected nonmaterial being (also) in motion. In such cases we may favor a nonmaterial deflector which is more capable of causing deflection under such situations.

The receiver or material collector could be positioned anywhere to collect the deflected nonmaterial. Actually it is not necessary that the nonmaterial projector surround the collector directly in about a common plane. It is more important that the rays be deflected to some intended receiver (if there is one) whether the receiver is within the immediate vicinity of the projector or not. Thus, for example, in the case of a nonmaterial projector in a loop form (e.g. circular, polygonal, elliptical) or partial loop form, the receiver could be somewhere within an imaginary prism or cylinder enclosing the loop. Further the (intended/material) receiver or collector could be some optical system (e.g. some focusing device, lens). Also the intended (material) receiver or collector could be remote, essentially absent or independent of the NDC.

The value of the angle of divergence (A) of the projected nonmaterial can be varied to satisfy needs and circumstances. This should be so irrespective of the direction (or sense for any direction) of the incident nonmaterial. Thus when in the case of an annular nonmaterial projector, this angle (A) is about 90°, the nonmaterial deflector of NDC is projected cylindrically or in prismatic form. Also the incident nonmaterial can be in any direction (and have any sense relative to the projected nonmaterial). Thus the incident nonmaterial can be oriented such that it is moving away from the outlet of projector of nonmaterial or moving towards it.

Any other nonmaterial could possibly be used in all places (such as ones described in this paper) where some particular nonmaterial (e.g. solar beam, electromagnetic wave, etc.) was used.

The receiving means, receiver, or material collector can also be anything to which it is desired to direct the deflected nonmaterial, for example: solar energy collector, solar cell, object to be heated or lighted up, anything needing/using the nonmaterial or its content, some (optical or other) system(s) which (for instance) may be needed to manipulate the nonmaterial. The receiver and the projector can be of any geometrical form in any of their dimensions. For example they could be about flat, elliptical, polygonal, built up (say like a dome, raised cylinder—single or staged), etc.

Note that (if need be) NDC can be equipped with means to help it start initially, say by means of external power source (say electricity, storage battery/cell) such that once started it should then be able to collect enough energy to sustain (power) its operation. Power from such sources can be used to generate radiation (say heat, and/or light) to be projected.

Figure 7:
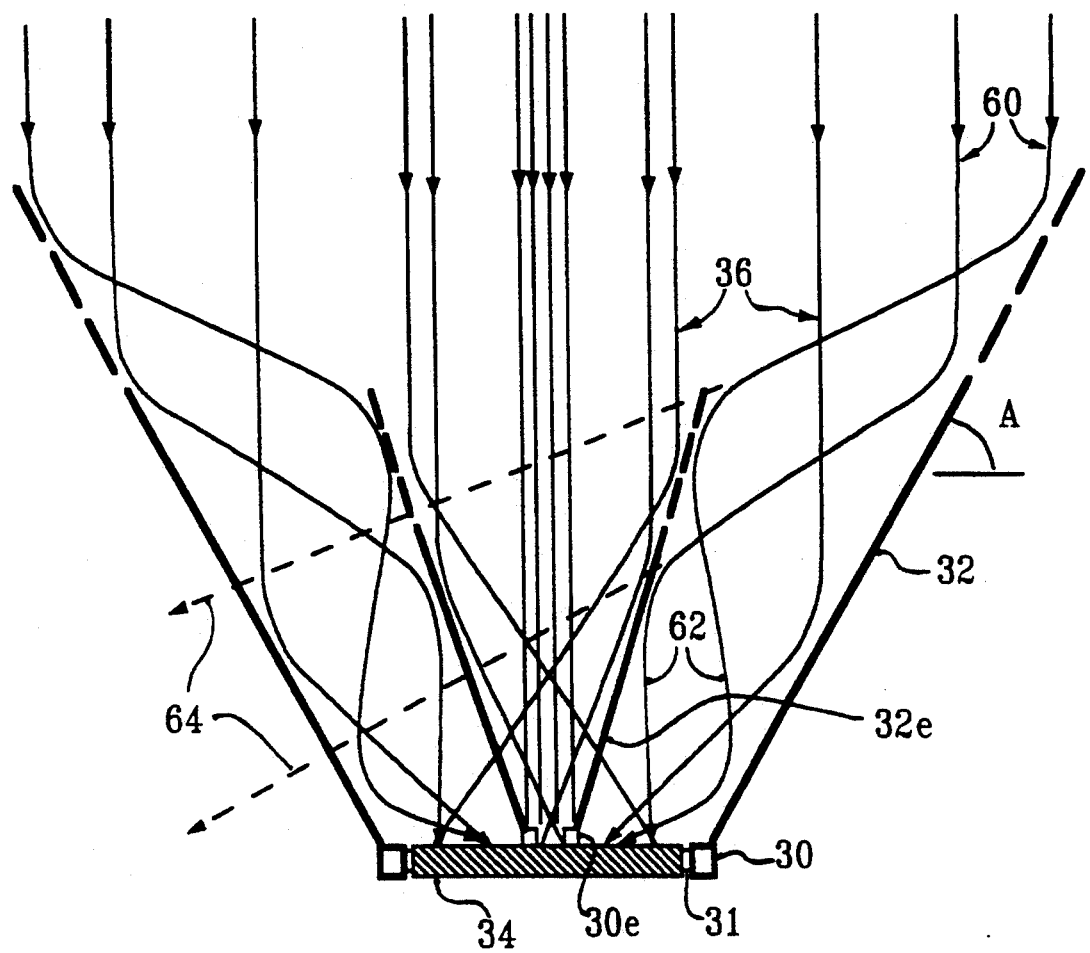
FIG. 7 shows Enhanced NDC using fiber-optic-like deflections, enabled by multiple deflectors (only two deflectors shown in this case, but there can be more than two), to trap rays that would have strayed off.
Figure 8:
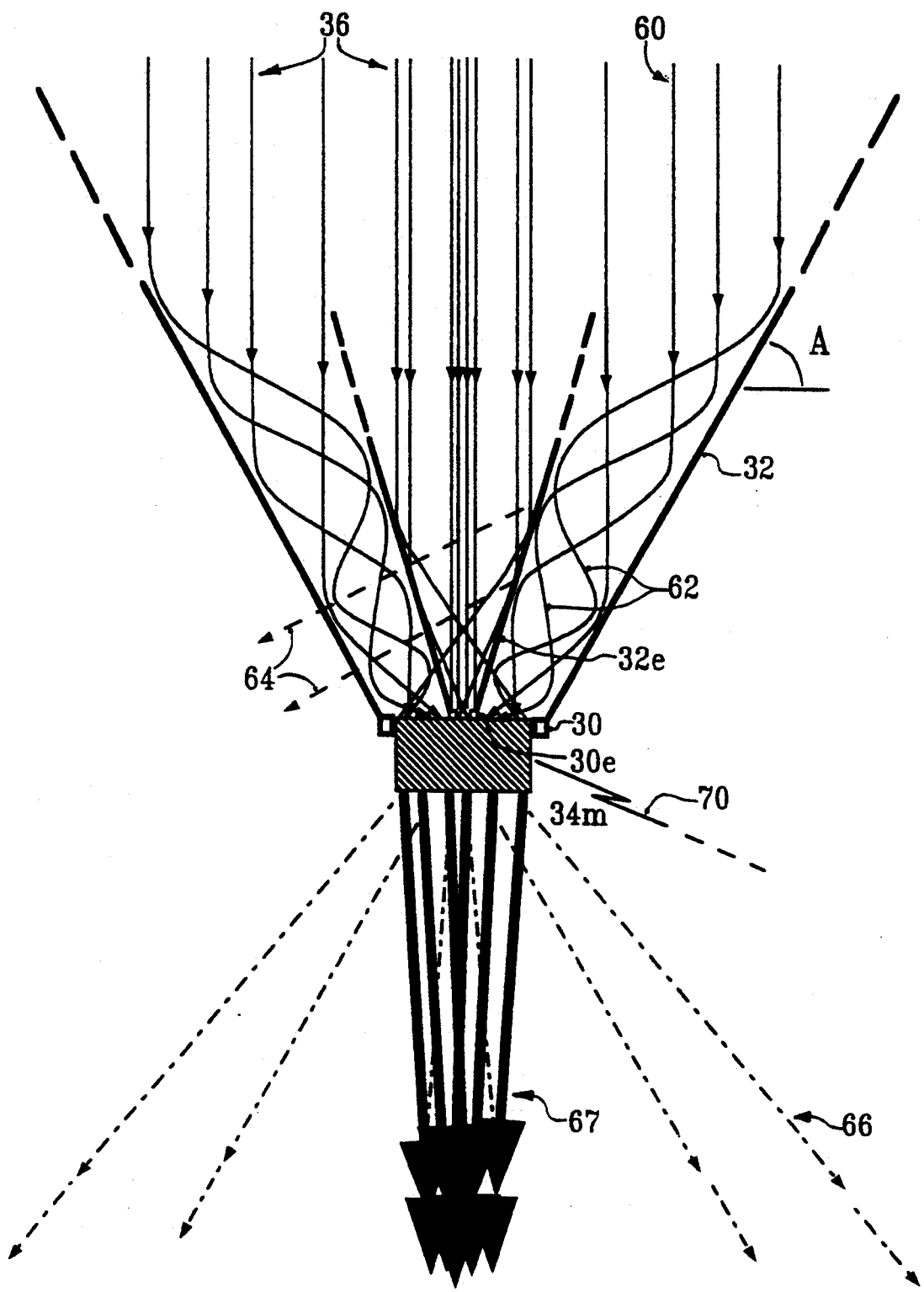
FIG. 8 shows enhanced NDC (FIG. 7) with optical system as (or included in) the receiver. It provides an ordinary example of design of Secondary Sun System (SSS). This system can be in the form of a basic NDC or enhanced NDC (as shown). A very powerful one may be very large and/or enhanced with many deflector systems.
Figure 9:
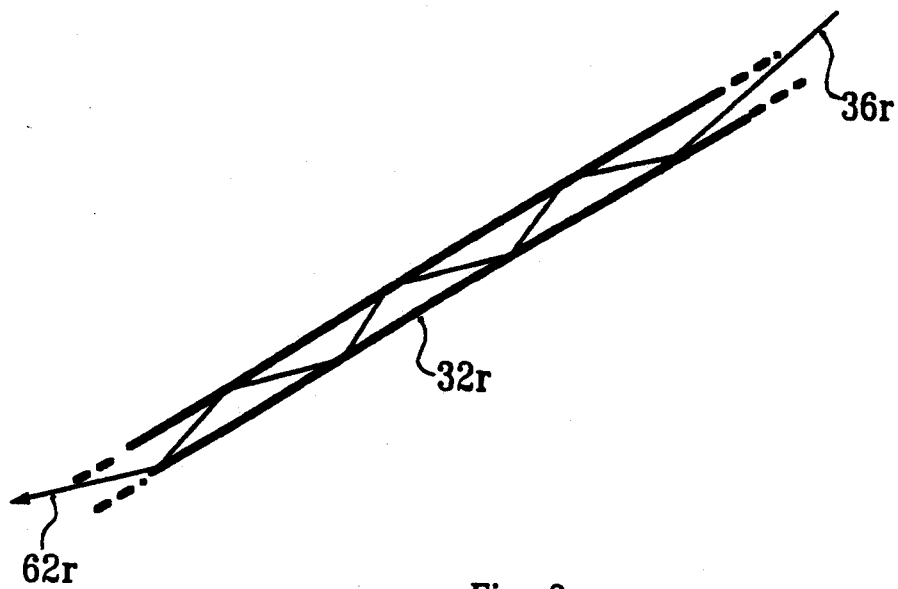
FIG. 9 shows an application of an embodiment of enhanced NDC in protection of ray of light (or other electromagnetic wave) in such applications as optical instruments (like telescope) and communication.

Also more projection(s) of nonmaterial(s) could be used within the collector (say from a concentric annular region on the surfaces of the material collector, receiver or optical setup) to induce fiber-optics-like deflections and help capture/guide/trap more rays that otherwise would go astray and not get received/collected (see FIGS. 7, 8). Other shapes and options may also be used here. Observe that a ray may go astray for various reasons, example: the ray's direction after initial deflection may not be towards the intended receiver or the ray may approach a nonmaterial deflector (this could be another part of same, essentially contiguous, deflector that deflected the ray initially) at such an angle that it cannot be deflected towards the intended receiver.

NDC can be used to deflect nonmaterial(s) using projected nonmaterial(s). NDC can possibly be used to deflect and/or collect radioactive radiations.

NDC can be used to obtain a "SECONDARY SUN": imagine an NDC as in FIG. 1, FIG. 2, FIG. 7, FIG. 8 (especially an enhanced NDC using fiber-opticslike deflections) made large enough and flown high enough to a location where it intercepts a lot of solar rays. If such a system is equipped with optical focusing device as (part of) the receiver and is also remotely controlled, then we can have, in effect, a "SECONDARY SUN"—under human control—whose rays can reach intended locations in a very short time. Such a system can also be very dangerous, especially if misused. A system of NDC type has so much potential that the need for caution to avoid misuse cannot be overemphasized. Excellent shutter system is also highly desirable for the secondary sun system. The energy gathered by the SS could also be delivered in other forms other than a beam of electromagnetic radiation. The SS system (SSS) could be made integral or modular (connected or independent), (integrally or separately) manned or unmanned and should, preferably, be powered by some of the energy it collects.

Nonmaterial deflectors can be used in communication systems to guide nonmaterial (e.g. electromagnetic wave) by fiber-optic-like deflections. Nonmaterial deflectors can also be used in many optic systems to change direction of light. Many other uses of NDC, its concepts and embodiments abound.

My above descriptions contains many specificities. But these should not be construed as limitations on the scope of the invention, but rather as an exemplification of main preferred embodiment thereof. Many more ramifications of NDC concept and applications abound as can be perceived by considering above explanations and figures. For example, the receiver of an NDC could be at the other end of the projected nonmaterial (the end away from the projector) and the incident nonmaterial could be (intentionally made) incident at any point in the projected nonmaterial—from the outlet of the projected nonmaterial to the effective termination point of the projected nonmaterial. Two or more NDC's could be made to interact (say communicate), e.g.: two NDC's could be made to face each other and some interaction means (such as electromagnetic wave) made to move between them. The projected nonmaterial could be projected in more complex formations/patterns to achieve various other forms of deflections. NDC can have multiple receivers, in series or parallel with respect to the direction of the deflected nonmaterial. NDC or any of its parts/system or embodiments could be made in various sizes and of various materials, colors and shapes. The SCP can be housed and the housing can provide support/relative-positioning required between the reflective surface and the optical system. The inlet of solar radiation into SCP can be covered with transparent material such as glass or plastic. When SCP is working the rays getting into it will likely include some deflected rays. Further (some of) the rays getting into the SCP may not be vertical enough. These may be negligible or may require that proper accommodating adjustments be made in design. The area close to the lens of SCP could be insulated from the (likely) hot region of the lens heated by the converging rays. Provision can be made to adjust position and/or orientation of the reflective surface and/or the optical system. Such adjustment(s) can, for instance, be used to: vary the intensity, and hence power (effective reach), of the projected ISB, or to vary the angle, A, the projected ISB makes with the horizontal.

Accordingly, the scope of the invention should be determined not by the embodiment(s) illustrated, but by the appended claims and their legal equivalents.

I claim:
1. In combination:
 (a) an artificial means for projecting nonmaterial; which projects
 (b) a projected nonmaterial; projected, usually, into a suitable medium such that said projected nonmaterial makes an oblique angle with the direction of an incident nonmaterial; and provides
 (c) a conditioned medium, in an area whose shape is substantially sustained and substantially selected from the group consisting of shapes of ruled surfaces and shapes predetermined by design, in which at least a portion of said incident nonmaterial can be deflected.
2. The invention of claim 1 wherein at least one of said projected nonmaterial and said incident nonmaterial comprises electromagnetic radiation and at least a portion of said projected nonmaterial is derived by using at least a portion of said incident nonmaterial.
3. The invention of claim 1 wherein said artificial means for projecting nonmaterial is such that shape of its outlet for said projected nonmaterial comprises a shape selected from the group consisting of annular and polygonal and curved.
4. The invention of claim 1 further including a receiving means; and wherein said projected nonmaterial is projected such that at least a portion of said incident nonmaterial is deflected towards said receiving means.
5. The invention of claim 4 wherein said incident nonmaterial comprises solar radiation and said receiving means comprises an element selected from the group consisting of solar energy collectors and means for manipulating solar radiation.
6. The invention of claim 1 wherein said projected nonmaterial comprises an element selected from the group consisting of intensified electromagnetic radiations and laser radiations and laser radiations; and said incident nonmaterial comprises an element selected from the group consisting of electromagnetic radiations and waves; and said conditioned medium comprises air, conditioned by said projected nonmaterial.
7. The invention of claim 1 further including a feature selected from the group consisting of said projected nonmaterial projected in a shape that would support fiber-optic-like deflections and additional projected nonmaterial along with additional artificial means for projecting said additional projected nonmaterial; such that at least a portion of said incident nonmaterial can be deflected more than once.
8. The invention of claim 1 wherein said artificial means for projecting nonmaterial comprises a structural form selected from the group consisting of loop form and partial loop form and annular form and modular form.
9. The invention of claim 1 wherein:
 (a) said projected nonmaterial comprises manipulated electromagnetic waves,
 (c) said conditioned medium comprises gas, conditioned by said manipulated electromagnetic waves to have different optical densities, and
 (b) said incident nonmaterial comprises electromagnetic waves.
10. A nonmaterial deflector system comprising:
 (a) means for projecting nonmaterial;
 (b) a projected nonmaterial, projected by said means for projecting nonmaterial;

(c) a medium, through which said projected nonmaterial is projected and which is conditioned by said projected nonmaterial;

(d) said projected nonmaterial having a direction so oblique to the direction of an incident nonmaterial, and said medium being so conditioned and sustained by said projected nonmaterial that at least a portion of said incident nonmaterial can be deflected in said medium;

(e) said projected nonmaterial comprising an element selected from the group consisting of artificially processed electromagnetic waves and artificial electromagnetic radiations and gases.

11. The invention of claim 10, further including a receiving means, comprising an element substantially selected from the group consisting of means for collecting electromagnetic energy and means for manipulating electromagnetic radiation, towards which at least a portion of said incident nonmaterial can be deflected; said incident nonmaterial comprising electromagnetic radiation;

whereby, when said receiving means comprises means for manipulating electromagnetic radiation and the invention is located where it can intercept substantial amount of solar radiation, the invention can be used to deliver energy, in the form of electromagnetic radiation, to other location;

thus substantially enabling use of said invention, as secondary sun system, sss:

to illuminate dark area of earth.

12. The invention of claim 10 wherein said projected nonmaterial comprises gas.

13. The invention of claim 10 further including a feature selected from the group consisting of said projected nonmaterial projected in cylindrical form and said projected nonmaterial projected in prismatic form and additional projected nonmaterial along with additional means for projecting said additional projected nonmaterial, arranged such that at least a portion of said incident nonmaterial can undergo plurality of deflections.

14. The invention of claim 10 wherein said projected nonmaterial comprises thermal radiation; said medium comprises air; said thermal radiation conditions said air to have temperature gradient and therefore optical density gradient.

15. The invention of claim 10 wherein at least a portion of said projected nonmaterial is derived by using at least a portion of said incident nonmaterial.

16. In combination:

(a) means for converging rays of nonmaterial; which, with a portion of incident rays of nonmaterial comprising an input, outputs converging rays of nonmaterial;

(b) a support means, which substantially maintains said means for converging rays of nonmaterial in predetermined relative position with (c) means for manipulating nonmaterial; which, with at least a portion of said converging rays of nonmaterial comprising an input, outputs (d) an intense beam of nonmaterial, substantially at such an intensity and orientation that at least another portion of said incident rays of nonmaterial obliquely incident on (e) a medium, conditioned by said intense beam of nonmaterial, can be deflected.

17. The invention of claim 16 wherein:

(a) said incident rays of nonmaterial comprise solar rays;

(b) said intense beam of nonmaterial comprises intensified solar beam;

(c) said means for manipulating nonmaterial comprises optical means.

18. The invention of claim 16 wherein said intense beam of nonmaterial is projected to suit an application selected from the group consisting of lighting and heating.

19. The invention of claim 16 wherein:

(a) said medium is conditioned by said intense beam of nonmaterial to substantially comprise layers having different optical densities;

(b) said incident rays nonmaterial comprise electromagnetic radiation.

20. The invention of claim 19 further including a receiving means, towards which at least a portion of said electromagnetic radiation can be deflected.

* * * * *

UNITED STATES PATENT AND TRADEMARK OFFICE
CERTIFICATE OF CORRECTION

PATENT NO. : 5,280,557
DATED : January 18, 1994
INVENTOR(S) : Daniel C. Nwasokwa It is certified that error appears in the above-indentified patent and that said Letters Patent is hereby corrected as shown below:

Cover page, last line of [56], change 'Barnch' to --Baruch--.

Column 1, line 50 of the specification, change 'such' to --much--.

Column 4, line 32 of the specification, change 'of with' to --with--

Column 4, line 44 of the specification, change 'projecting' to --projector--.

Column 5, line 43 of the specification, change 'an other' to --any other--.

Column 10, line 49 of the specification, change ';' to --:--.

Column 11, line 16 of the specification, change 'part of the' to --part of) the--.

Column 13, lines 36 - 40 of the specification, delete 'so that the incident nonmaterial ... from said projected nonmaterial'.

Column 16, line 19 of the specification, change 'or each' to -- for each--.

Column 18, line 7 of the specification, change '= cot T' to --= - cot T--.

Column 19, line 7 of the specification, change '1/2' to superscript --1/2 --.

Column 22, line 38 of the specification, change 'laser radiations and laser radiations;' to --laser radiations and maser radiations;--.

UNITED STATES PATENT AND TRADEMARK OFFICE
CERTIFICATE OF CORRECTION

PATENT NO. : 5,280,557
DATED : January 18, 1994
INVENTOR(S) : Daniel C. Nwasokwa It is certified that error appears in the above-indentified patent and that said Letters Patent is hereby corrected as shown below:

Column 24, line 39 of the specification, change 'rays nonmaterial' to --rays of nonmaterial--.

Signed and Sealed this

Twenty-ninth Day of November, 1994

Attest:

BRUCE LEHMAN

Attesting Officer    Commissioner of Patents and Trademarks